US011489127B2

(12) United States Patent
Jung et al.

(10) Patent No.: US 11,489,127 B2
(45) Date of Patent: Nov. 1, 2022

(54) STRETCHABLE DISPLAY DEVICE

(71) Applicant: LG Display Co., Ltd.

(72) Inventors: Hyunju Jung, Seoul (KR); Eunah Kim, Seosan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/106,065

(22) Filed: Nov. 27, 2020

(65) Prior Publication Data

US 2021/0083212 A1 Mar. 18, 2021

Related U.S. Application Data

(63) Continuation of application No. 16/600,346, filed on Oct. 11, 2019, now Pat. No. 10,886,483.

(30) Foreign Application Priority Data

Nov. 6, 2018 (KR) .......................... 10-2018-0135263

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3246* (2013.01); *H01L 27/3276* (2013.01); *H01L 51/5253* (2013.01); *H01L 2251/5338* (2013.01)

(58) Field of Classification Search
CPC ............ H01L 51/0097; H01L 27/3246; H01L 27/3276; H01L 51/5253; H01L 2251/5338; H01L 25/048; H01L 25/0753; H01L 25/167; H01L 27/3244; H01L 27/3293; H01L 2251/56; Y02E 10/549; Y02P 70/50; G09F 9/301
See application file for complete search history.

(56) References Cited

U.S. PATENT DOCUMENTS

| | | | |
|---|---|---|---|
| 2014/0218872 A1 | 8/2014 | Park et al. |
| 2016/0028043 A1 | 1/2016 | Kwon et al. |
| 2017/0005077 A1 | 1/2017 | Kim et al. |
| 2017/0294610 A1 | 10/2017 | Sasaki |
| 2018/0090699 A1 | 3/2018 | Shin et al. |

FOREIGN PATENT DOCUMENTS

| | | |
|---|---|---|
| CN | 108183126 A | 6/2018 |
| KR | 10-2016-0087291 A | 7/2016 |
| TW | 201840029 A | 11/2018 |

OTHER PUBLICATIONS

European Search Report dated Apr. 15, 2020 issued in corresponding Patent Application No. 19202440.4 (8 pages).

*Primary Examiner* — Cuong B Nguyen
(74) *Attorney, Agent, or Firm* — Polsinelli PC

(57) ABSTRACT

A stretchable display device comprises a plurality of island substrates where a plurality of pixels is defined and spaced apart from each other; a lower substrate disposed under the plurality of island substrates and including a plurality of grooves; and a plurality of connecting lines electrically connecting a plurality of pads disposed on adjacent island substrates of the plurality of island substrates; and a lower adhesive layer disposed under the plurality of island substrates and the plurality of connecting lines, and overlapping the plurality of island substrates.

14 Claims, 12 Drawing Sheets

STRETCHABLE DISPLAY DEVICE

CROSS-REFERENCE TO RELATED APPLICATION

This application is a continuation of U.S. application Ser. No. 16/600,346, filed Oct. 11, 2019, which application claims the priority of Korean Patent Application No. 10-2018-0135263 filed on Nov. 6, 2018, of which the full disclosures of these applications are incorporated herein by reference for all purposes.

BACKGROUND

Field of the Disclosure

The present disclosure relates to a display device, and more particularly, to a stretchable display device. Although the present disclosure is suitable for a wide scope of applications, it is particularly suitable for improving reliability the stretchable display device by attenuating stress generated by stretching of the stretchable display device.

Description of the Background

An organic light emitting display (OLED) that emits light by itself and a liquid crystal display (LCD) that requires separate light sources are currently used as display devices for a computer monitor, a TV and a mobile phone, etc.

The display devices have been applied in various fields including not only a computer monitor and a TV, but personal mobile devices, and the display devices having a wide active area and reduced volume and weight is currently studied.

Recently, a stretchable display device manufactured that can be stretched/contracted in a specific direction and changed into various shapes by forming a display unit, lines, etc. on a flexible substrate such as plastic that is a flexible material has been spotlighted as a next generation display device.

SUMMARY

Accordingly, the present disclosure is directed to a stretchable display device that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

The present disclosure provides a stretchable display device that can minimize stress that concentrates on the boundaries of a plurality of island substrates when the stretchable display device is stretched, by disposing an adhesive layer to overlap the boundaries of the plurality of island substrates.

The present disclosure provides a stretchable display device that can improve the adhesive strength of a first lower pattern and a second lower pattern that constitute a lower substrate by disposing an adhesive layer between the first lower pattern and the second lower pattern.

The present disclosure provides a stretchable display device that can minimize stress that is generated when the stretchable display device is stretched, by configuring an adhesive layer disposed between a first lower pattern and a second lower pattern as a multi-layer.

The present disclosure provides a stretchable display device that can minimize stress that concentrates on connecting lines when the stretchable display device is stretched, by disposing an adhesive layer under the connecting lines.

The present disclosure is not limited to the above-mentioned objects, and other objects, which are not mentioned above, can be clearly understood by those skilled in the art from the following descriptions.

In order to achieve the aspects of the present disclosure, a stretchable display device according to an aspect of the present disclosure includes: a plurality of island substrates in which a plurality of pixels is defined and that is spaced apart from each other; a lower substrate disposed under the plurality of island substrates and including a plurality of grooves; a plurality of connecting lines electrically connecting pads disposed on adjacent island substrates of the plurality of island substrates; and a lower adhesive layer disposed under the plurality of island substrates and the plurality of connecting lines, in which the lower adhesive layer may be disposed to overlap boundaries of the plurality of island substrates.

A stretchable display device according to another aspect of the present disclosure includes: a plurality of rigid substrates in which a plurality of pixels is defined and that is spaced apart from each other; a flexible substrate disposed under the plurality of rigid substrates and including a plurality of rigid lower patterns and a flexible lower pattern; and a lower adhesive layer disposed to overlap boundaries of the plurality of rigid substrates, in which the lower adhesive layer may bond the plurality of rigid lower patterns, the flexible lower pattern, and the plurality of rigid substrates.

Other detailed matters of the exemplary aspects are included in the detailed description and the drawings.

The present disclosure has the effect of reducing stress that concentrates on boundaries of island substrates when a stretchable display device is stretched.

The present disclosure has the effect of being able to minimize separation of a plurality of island substrates from a lower substrate when a stretchable display device is stretched.

The present disclosure has the effect of reducing damage to connecting lines due to stress when a stretchable display device is stretched.

The present disclosure has the effect of reducing movement of display elements according to stretching of a stretchable display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
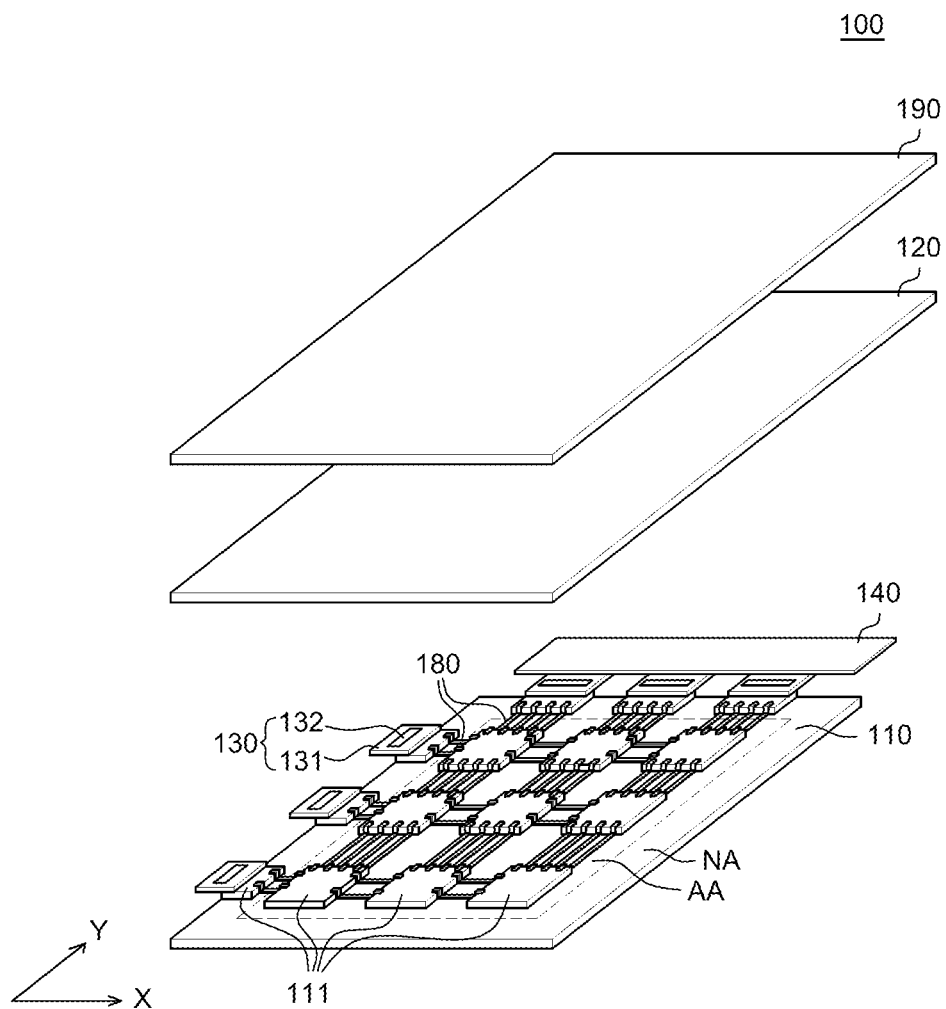
FIG. 1 is an exploded perspective view of a stretchable display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

The terms "lower", "upper", "bottom" and "top", where referring to spatial positioning, are referenced to the typical orientation from which the display is viewed. That is to say that "upper" and "top" are closer to the typical viewing surface than "lower" and "bottom".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

A stretchable display device may be referred to as a display device that can display images even if it bends or stretches. A stretchable display device may have a high flexibility, as compared with the conventional display devices. Accordingly, the shape of the stretchable display device may be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device may be disposed to be bent into the surface shape of the wall. Further, when the force applied by a user is removed, the stretchable display device can return to the initial shape.

FIG. 1 is an exploded perspective view of a display device according to an aspect of the present disclosure. Referring to FIG. 1, a stretchable display device 100 includes a lower substrate 110, a plurality of island substrates 111, a plurality of connecting lines 180, chip on films (COF) 130, a printed circuit board 140, an upper substrate 120, and a polarizing layer 190. The X-axis direction and Y-axis direction are positioned in a plane parallel to the display surface and are referenced to the typical viewing orientation.

The lower substrate 110 is a substrate for supporting and protecting various components of the stretchable display device 100. The lower substrate 110, which is a flexible substrate, may be made of a bendable or stretchable insulating material. For example, the lower substrate 110 may be made of silicon rubber such as polydimethylsiloxane (PDMS) or an elastomer such as polyurethane (PU) and polytetrafluoroethylene (PTFE), so it can have flexibility. The material of the lower substrate 110, however, is not limited thereto.

The lower substrate 110, which is a flexible substrate, may be reversibly expanded and contracted. Further, an elastic modulus may be several to hundreds of MPa and a tensile fracture rate may be 100% or more. The thickness of the lower substrate may be 10 μm to 1 mm, but is not limited thereto.

The lower substrate 110 may have an active area AA and a non-active area NA surrounding the active area AA.

The active area AA is an area where images are displayed on the stretchable display device 100, and display elements and various driving elements for driving the display elements are disposed in the active area AA. The active area AA includes a plurality of pixels including a plurality of subpixels. The plurality of pixels is disposed in the active area AA and includes a plurality of display elements. The plurality of subpixels each can be connected with various lines. For example, the plurality of subpixels each can be connected with various lines such as a gate line, a data line, a high-potential power line, a low-potential power line, and a reference voltage line.

The non-active area NA is an area adjacent to the active area AA. The non-active area NA is an area disposed adjacent to the active area AA and surrounding the active area AA. The non-active area NA is an area where an image is not displayed, and lines, circuit units, etc. may be disposed in the non-active area NA. For example, a plurality of pads may be disposed in the non-active area NA and each of the pads may be connected with each of the subpixels in the active area AA.

The plurality of island substrates 111 is disposed on the lower substrate 110. The plurality of island substrates 111, which is rigid substrates, is spaced apart from each other and disposed on the lower substrate 110. The plurality of island substrates 111 may be more rigid than the lower substrate 110. That is, the lower substrate 110 may be softer than the plurality of island substrates 111, and the plurality of island substrates 111 may be more rigid than the lower substrate 110.

The plurality of island substrates 111, which is a plurality of rigid substrates, may be made of a plastic material having flexibility and, for example, may be made of polyimide (PI), polyacrylate, polyacetate, etc.

The modulus of the plurality of island substrates 111 may be higher than that of the lower substrate 110. The modulus is an elastic modulus showing the ratio of deformation of a substrate caused by stress to stress applied to the substrate, and when the modulus is relatively high, the hardness may be relatively high. Accordingly, the plurality of island substrates 111 may be a plurality of rigid substrates that is more rigid than the lower substrate 110. The modulus of the plurality of island substrates 111 may be at least a thousand times larger than that of the lower substrate 110, but is not limited thereto.

The plurality of connecting lines 180 is disposed between the plurality of island substrates 111. The connecting lines 180 may be disposed between the pads disposed on the plurality of island substrates 111 and may electrically connect each pad. The connecting lines 180 will be described in more detail with reference to FIG. 2.

The COFs 130, which are films having various components on flexible base films 131, are components for supplying signals to the plurality of subpixels in the active area AA. The COFs 130 may be bonded to the plurality of pads disposed in the non-active area NA and supply a power voltage, a data voltage, a gate voltage, etc. to each of the plurality of subpixels in the active area AA through the pads. The COFs 130 include a base film 131 and a driving IC 132 and, in addition, the COFs 130 may include various other components.

The base films 131 are layers supporting the driving ICs 132 of the COFs 130. The base films 131 may be made of an insulating material, for example, an insulating material having flexibility.

The driving ICs 132 are components that process data for displaying images and driving signals for processing the data. Although the driving ICs 132 are mounted in the type of the COF 130 in FIG. 1, the driving ICs 132 are not limited thereto, and the driving ICs 132 may be mounted in the type of chip on glass (COG), tape carrier package (TCP), etc.

Controllers such as an IC chip and a circuit unit may be mounted on the printed circuit board 140. Further, a memory, a processor, etc. also may be mounted on the printed circuit board 140. The printed circuit board 140 has a configuration that transmits signals for driving the display elements from the controllers to the display elements.

The printed circuit board 140 is connected with the COFs 130, so they can be electrically connected with each of the plurality of subpixels on the plurality of island substrates 111.

The upper substrate 120 is a substrate overlapping the lower substrate 110 to protect various components of the stretchable display device 100. The upper substrate 120, which is a flexible substrate, may be made of a bendable or stretchable insulating material. For example, the upper substrate 120 may be made of a flexible material and may be made of the same material as the lower substrate 110, but is not limited thereto.

The polarizing layer 190, which has a configuration suppressing external light reflection of the stretchable display device 100, may overlap the upper substrate 120 and may be disposed on the upper substrate 120. However, the polarizing layer 190 is not limited thereto and, may be disposed under the upper substrate 120, or may be omitted, depending on the configuration of the stretchable display device 100.

Figure 2:
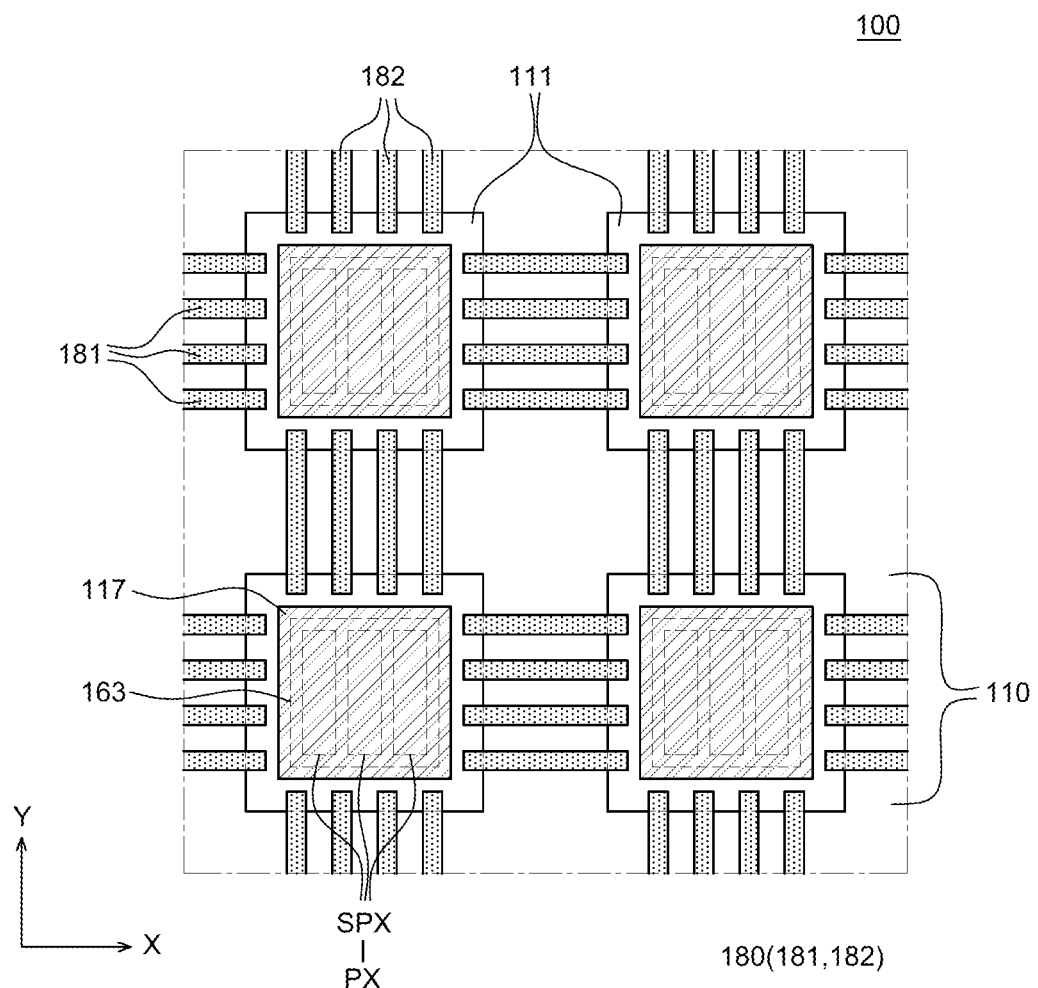
FIG. 2 is an enlarged plan view of the stretchable display device according to an aspect of the present disclosure.
Figure 3:
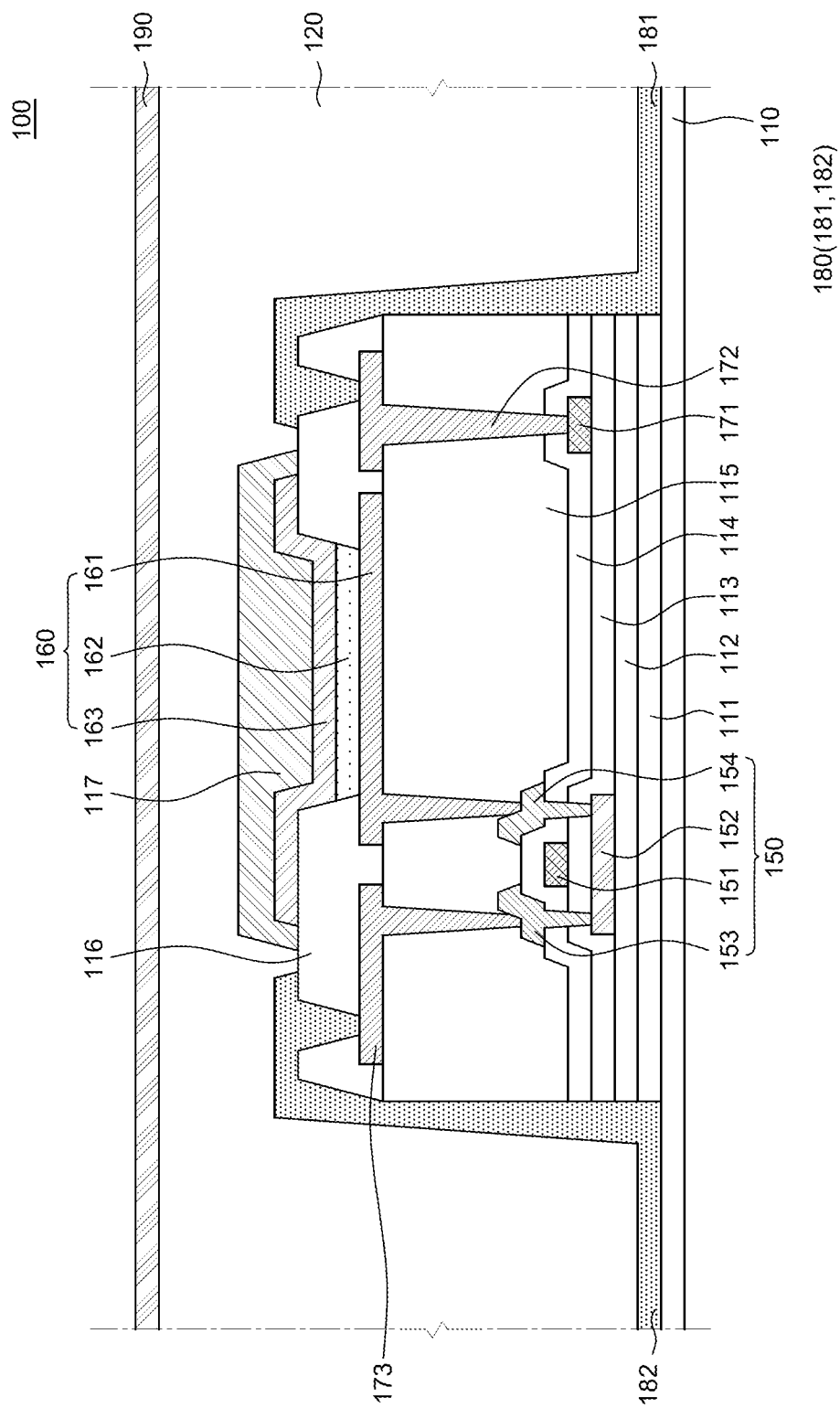
FIG. 3 is a schematic cross-sectional view of one subpixel of FIG. 1.

FIGS. 2 to 3 are referred to hereafter to describe in more detail the stretchable display device 100 according to an aspect of the present disclosure.

FIG. 2 is an enlarged plan view of the stretchable display device according to an aspect of the present disclosure. FIG. 3 is a schematic cross-sectional view of a subpixel of FIG. 1. FIG. 1 is referred to for the convenience of description.

Referring to FIGS. 2 and 3, the plurality of island substrates 111 is disposed on the lower substrate 110. The plurality of island substrates 111 is spaced apart from each other and disposed on the lower substrate 110. For example, the plurality of island substrates 111, as shown in FIGS. 1 and 2, may be disposed in a matrix shape on the lower substrate 110, but is not limited thereto.

Referring to FIG. 3, a buffer layer 112 is disposed on the plurality of island substrates 111. The buffer layer 112 is formed on the plurality of island substrates 111 to protect various components of the stretchable display device 100 against permeation of water (H2O), oxygen (O2), etc. from the outside from the lower substrate 110 and the plurality of island substrates 111. The buffer layer 112 may be made of an insulating material, and for example, may be a single inorganic layer or a multi-inorganic layer made of one of graphite, silicon nitride, silicon oxide (SiOx), silicon oxynitride (SiON), and the like. However, the buffer layer 112 may be omitted, depending on the structure or characteristics of the stretchable display device 100.

In this regard, the buffer layer 112 may be formed only in the areas overlapping the plurality of island substrates 111. As described above, since the buffer layers 112 may be made of an inorganic material, they may be easily damaged, such as cracking, when the stretchable display device 100 is stretched. Accordingly, the buffer layer 112 is patterned in the shape of the plurality of island substrates 111 without being formed in the areas between the plurality of island substrates 111, whereby it can be formed only over the plurality of island substrates 111. Therefore, since the buffer layer 112 is formed only in the areas overlapping the plurality of island substrates 111 that is rigid substrates, damage to the buffer layer 112 can be suppressed even though the stretchable display device 100 according to an aspect of the present disclosure is deformed, such as, bending or stretching.

Referring to FIG. 3, a transistor 150 including a gate electrode 151, an active layer 152, a source electrode 153, and a drain electrode 154 is formed on the buffer layer 112. For example, the active layer 152 is formed on the buffer layer 112, and a gate insulating layer 113 for insulating the active layer 152 and the gate electrode 151 from each other is formed on the active layer 152. An inter-layer insulating layer 114 is formed to insulate the gate electrode 151, the source electrode 153, and the drain electrode 154, and the source electrode 153 and the drain electrode 154, which are respectively in contact with the active layer 152 and are formed on the inter-layer insulating layer 114.

The gate insulating layer 113 and the inter-layer insulating layer 114 may be formed only in the areas overlapping the plurality of island substrates 111 by patterning. The gate insulating layer 113 and the inter-layer insulating layer 114 may also be made of an inorganic material like the buffer layer 112, so they may be easily damaged such as cracking when the stretchable display device 100 is stretched. Accordingly, the gate insulating layer 113 and the inter-layer insulating layer 114 are patterned in the shape of the plurality of island substrates 111 without being formed in the areas between the plurality of island substrates 111. Thus, they can be formed only on the plurality of island substrates 111.

Only a driving transistor among various transistors that may be included in the stretchable display device 100 is shown in FIG. 3 for the convenience of description, but a switching transistor, a capacitor, etc. can also be included in the display device. Further, although the transistor 150 is described as having a coplanar structure in this specification, various transistors, for example, having a staggered structure also may be used.

Referring to FIG. 3, a gate pad 171 is disposed on the gate insulating layer 113. The gate pad 171 is a pad for transmitting a gate signal to a plurality of subpixels SPX. The gate pad 171 may be made of the same material as the gate electrode 151, but is not limited thereto.

Referring to FIG. 3, a planarization layer 115 is formed on the transistor 150 and the inter-layer insulating layer 114. The planarization layer 115 planarizes the top of the transistor 150. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the transistor 150 and an anode 161, a contact hole for electrically connecting a data pad 173 and the source electrode 153, and a contact hole for electrically connecting a connecting pad 172 and a gate pad 171.

In some aspects, a passivation layer may be formed between the transistor 150 and the planarization layer 115. That is, the passivation layer covering the transistor 150 may be formed to protect the transistor 150 from permeation of water, oxygen, etc. The passivation layer may be made of an inorganic material and may be composed of a single layer or a multi-layer, but is not limited thereto.

Referring to FIG. 3, the data pad 173, the connecting pad 172, and the organic light emitting element 160 are disposed on the planarization layer 115.

The data pad 173 may transmit a data signal from a connecting line 180, which functions as a data line, to a plurality of subpixels SPX. The data pad 173 is connected with the source electrode 153 of the transistor 150 through a contact hole formed at the planarization layer 115. The data pad 173 may be made of the same material as the anode 161 of the organic light emitting element 160, but is not limited thereto. Further, the data pad 173 may be made of the same material as the source electrode 153 and the drain electrode 154 of the transistor 150, not on the planarization layer 115, but on the inter-layer insulating layer 114.

The connecting pad 172 can transmit a gate signal from a connecting line 180, which functions as a gate line, to a plurality of subpixels SPX. The connecting pad 172 is connected with the gate pad 171 through contact holes formed at the planarization layer 115 and the inter-layer insulating layer 114 and transmits a gate signal to the gate pad 171. The connecting pad 172 may be made of the same material as the data pad 173, but is not limited thereto.

The organic light emitting elements 160 are components disposed to correspond to a plurality of subpixel SPX, respectively, and emitting light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 100 may further include a color filter.

The organic light emitting element 160 includes an anode 161, an organic light emitting layer 162, and a cathode 163. In detail, the anode 161 is disposed on the planarization layer 115. The anode 161 is an electrode configured to supply holes to the organic light emitting layer 162. The anode 161 may be made of a transparent conductive material with a high work function. Here, the transparent conductive material may include indium tin oxide (ITO), indium zinc oxide (IZO), and indium tin zinc oxide (ITZO). The anode 161 may be made of the same material as the data pad 173 and the gate pad 171 disposed on the planarization layer 115, but is not limited thereto. Further, when the stretchable display device 100 is implemented in a top emission type, the anode 161 may further include a reflective plate.

The anodes 161 are spaced apart from each other respectively for subpixels SPX and electrically connected with the transistor 150 through a contact hole of the planarization layer 115. For example, although the anode 161 is electrically connected with the drain electrode 154 of the transistor 150 in FIG. 2, the anode 161 may be electrically connected with the source electrode 153.

A bank 116 is formed on the anode 161, the data pad 173, the connecting pad 172, and the planarization layer 115. The bank 116 is a component separating adjacent subpixels SPX. The bank 116 is disposed to cover at least partially both sides of adjacent anodes 161, thereby partially exposing the top surface of the anode 161. The bank 116 may perform a role in suppressing the problem that an unexpected subpixel SPX emits light or colors are mixed by light emitted in the lateral direction of the anode 161 due to concentration of a current on the corner of the anode 161. The bank 116 may be made of acrylic-based resin, benzocyclobutene (BCB)-based resin, or polyimide, but is not limited thereto.

Although the organic light emitting element 160 is described as being used as a light emitting element in this specification, the present disclosure is not limited thereto and a light emitting diode (an LED) may be used as the light emitting element.

The bank 116 has a contact hole for connecting the connecting line 180 functioning as a data line and the data pad 173 and a contact hole for connecting the connecting line 180 functioning as a gate line and the connecting pad 172.

The organic light emitting layer 162 is disposed on the anode 161. The organic light emitting layer 162 is configured to emit light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with a charge generation layer therebetween. The organic light emitting layer 162 may further include at least one organic layer of a hole transporting layer, an electron transporting layer, a hole blocking layer, an electron blocking layer, a hole injection layer, and an electron injection layer.

Referring to FIGS. 2 and 3, the cathode 163 is disposed on the organic light emitting layer 162. The cathode 163 supplies electrons to the organic light emitting layer 162. The cathode 163 may be made of indium tin oxide (ITO)-based, indium zin oxide (IZO)-based, indium tin zinc oxide (ITZO)-based, zinc oxide (ZnO)-based, and tin oxide (TO)-based transparent conductive oxides or an Ytterbium (Yb) alloy. Alternatively, the cathode 163 may be made of a metal material.

The cathodes 163 may be formed by patterning to respectively overlap the plurality of island substrates 111. That is, the cathodes 163 may be disposed not in the areas between the plurality of island substrates 111, but only in the areas overlapping the plurality of island substrates 111. Since the cathodes 163 are made of a material, such as, a transparent conductive oxide, a metal material, etc., when the cathodes 163 are formed even in the areas between the plurality of island substrates 111, the cathodes 163 may be damaged when the stretchable display device 100 is stretched/contracted. Accordingly, the cathodes 163 may be formed to respectively correspond to the plurality of island substrates 111 on the plane. Referring to FIGS. 2 and 3, the cathodes 163 may be formed to have an area not overlapping the area where a connection line 180 is disposed, of the areas overlapping the plurality of island substrates 111.

Unlike the conventional organic light emitting display devices, the cathodes 163 are formed by patterning to correspond to the plurality of island substrate 111 in the stretchable display device 100 according to an aspect of the present disclosure. Accordingly, each of the cathodes 163 disposed on the plurality of island substrates 111 may be independently supplied with low-potential power through the connecting lines 180.

Referring to FIGS. 2 and 3, an encapsulation layer 117 is disposed on the organic light emitting element 160. The encapsulation layer 117 can seal the organic light emitting element 160 by covering the organic light emitting element 160 in contact with a portion of the top surface of the bank 116. Accordingly, the encapsulation layer 117 protects the organic light emitting element 160 from water, air, or physical shock that may permeate from the outside.

The encapsulation layers 117 respectively cover the cathodes 163 patterned to respectively overlap the plurality of island substrate 111 and may be formed on the plurality of island substrates 111, respectively. That is, the encapsulation layer 117 is disposed to cover one cathode 163 on one island substrate 111 and the encapsulation layers 117 disposed on each of the plurality of island substrates 111 may be spaced apart from each other.

The encapsulation layer 117 may be formed only in the areas overlapping the plurality of island substrates 111. As described above, since the encapsulation layers 117 may be configured to include an inorganic layer, they may be easily damaged, such as cracking, when the stretchable display device 100 is stretched. In particular, since the organic light emitting element 160 is vulnerable to water or oxygen, when the encapsulation layer 117 is damaged, reliability of the organic light emitting element 160 may be reduced. Therefore, since the encapsulation layer 117 is not formed in the areas between the plurality of island substrates 111 in the stretchable display device 100 according to an aspect of the present disclosure, damage to the encapsulation layer 117 can be minimized even though the stretchable display device 100 according to an aspect of the present disclosure is deformed, such as, bending or stretching.

Compared with the conventional flexible organic light emitting display devices the stretchable display device 100 according to an aspect of the present disclosure has a structure in which the plurality of island substrates 111 that is relatively rigid is spaced apart from each other and disposed on the lower substrate 110 that is relatively soft. The cathodes 163 and the encapsulation layers 117 of the stretchable display device 100 are disposed by patterning to correspond to the plurality of island substrates 111, respectively. That is, the stretchable display device 100 according to an aspect of the present disclosure may have a structure that enables the stretchable display device 100 to be more easily deformed when a user stretches or bends the stretchable display device 100 and may have a structure that can minimize damage to the components of the stretchable display device 100 when the stretchable display device 100 is deformed.

The connecting lines 180 are lines that electrically connect the pads on the plurality of island substrates 111. The connecting lines 180 include first connecting lines 181 and second connecting lines 182. The first connecting lines 181 are lines extending in the X-axial direction of the connecting lines 180 and the second connecting lines 182 are lines extending in the Y-axial direction of the connecting lines 180.

In the conventional organic light emitting display devices, various lines such as a plurality of gate lines and a plurality of data lines are extended and disposed between a plurality of subpixels, and a plurality of subpixels is connected to one signal line. Accordingly, in the conventional organic light emitting display devices, various lines such as gate lines, data lines, high-potential power lines, and reference voltage lines extend from a side to the other side of the organic light emitting display devices without disconnecting on the substrate.

However, in the stretchable display device 100 according to an aspect of the present disclosure, various lines such as gate lines, data lines, high-potential power lines, and reference voltage lines, which are made of a metal material, are disposed only on the plurality of island substrates 111. That is, in the stretchable display device 100 according to an aspect of the present disclosure, various lines made of a metal material may be disposed only on the plurality of island substrates 111 and may not be formed to be in contact with the lower substrate 110. Accordingly, various lines may be patterned to correspond to the plurality of island substrates 111 and discontinuously disposed.

In the stretchable display device 100 according to an aspect of the present disclosure, the pads on two adjacent island substrates 111 may be connected by a connecting line 180 to connect the discontinuous lines. That is, a connecting line 180 electrically connects the pads on two adjacent island substrates 111. Accordingly, the stretchable display device 100 of the present disclosure includes a plurality of connecting lines 180 to electrically connect various lines such as gate lines, data lines, high-potential power lines, and reference voltage lines between the plurality of island substrates 111. For example, the gate lines may be disposed on a plurality of island substrates 111 disposed adjacent to each other in the X-axial direction, and the gate pads 171 may be disposed at both ends of the gate lines. At this time, each of the plurality of gate pads 171 on the plurality of island substrates 111 disposed adjacent to each other in the X-axial direction can be connected to each other by a connecting line 180 functioning as a gate line. Accordingly, the gate lines disposed on the plurality of island substrates 111 and the connecting lines 180 disposed on the lower substrate 110 may function as one gate line. Further, all various lines that may be included in the stretchable display device 100, such as the data lines, high-potential power lines, and reference voltage lines, also each may function as one line by a connecting line 180, as described above.

Referring to FIG. 2, a first connecting line 181 may connect the pads on two parallel island substrates 111 of the pads of the plurality of island substrates 111 disposed adjacent to each other in the X-axial direction. The first connecting line 181 may function as a gate line or a low-potential power line, but is not limited thereto. For example, the first connecting line 181 may function as a gate line and may electrically connect the gate pads 171 on two X-axially parallel island substrates 111 through a contact hole formed at the bank 116. Accordingly, as described above, the gate pads 171 on a plurality of island substrates 111 disposed in the X-axial direction may be connected by first connecting lines 181 that function as gate lines, and one gate signal may be transmitted.

Referring to FIG. 2, a second connecting line 182 may connect the pads on two parallel island substrates 111 of the pads on the plurality of island substrates 111 disposed adjacent to each other in the Y-axial direction. The second connecting line 182 may function as a data line, a high-potential power line, or a reference voltage line, but is not limited thereto. For example, the second connecting line 182 may function as a data line and may electrically connect the data pads 173 on two Y-axially parallel island substrates 111 through a contact hole formed at the bank 116. Accordingly, as described above, the data pads 173 on a plurality of island substrates 111 disposed in the Y-axial direction may be connected by a plurality of second connecting lines 182 that functions as data lines, and one data signal may be transmitted.

Referring to FIG. 2, the connecting line 180 includes a base polymer and conductive particles. In detail, the first connecting line 181 includes a base polymer and conductive particles and the second connecting line 182 includes a base polymer and conductive particles.

The first connecting line 181 may be formed by extending to the top surface of the lower substrate 110 in contact with the top surface and a side surface of the bank 116, and side surfaces of the planarization layer 115, the inter-layer insulating layer 114, and the buffer layer 112, which are disposed on the island substrate 111, and sides of the plurality of island substrates 111. Accordingly, the first connecting line 181 may be in contact with the top surface of the lower substrate 110, a side surface of an adjacent island substrate 111, and side surfaces of the buffer layer 112, the gate insulating layer 113, the inter-layer insulating layer 114, the planarization layer 115, and the bank 116 disposed on the adjacent island substrate 111. The first connecting line 181 may be in contact with the connecting pads 172 disposed on adjacent island substrates 111, but is not limited thereto.

The base polymer of the first connecting line 181 may be made of a bendable or stretchable insulating material similar to the lower substrate 110. The base polymer, for example, may include silicon rubber such as polydimethylsiloxane (PDMS), an elastomer such as polyurethane (PU) and polytetrafluoroethylene (PTFE)( ), styrene butadiene styrene (SBS), etc., but is not limited thereto. Accordingly, when the stretchable display device 100 is bent or stretched, the base polymer may not be damaged. The base polymer may be formed by coating a material constituting the base polymer or applying the material using a slit on the lower substrate 110 and an island substrate 111.

The conductive particles of the first connecting line 181 may be distributed in the base polymer. In detail, the first connecting line 181 may include conductive particles distributed with predetermined density in the base polymer. The first connecting line 181, for example, may be formed by uniformly stirring conductive particles in a base polymer and then coating or hardening the base polymer with the conductive particles distributed therein onto the lower substrate 110 and the island substrate 111, but is not limited thereto. The conductive particles may include at least one of silver (Ag), gold (Au), and carbon, but is not limited thereto.

The conductive particles disposed and distributed in the base polymer of the first connecting line 181 may form a conductive path electrically connecting the connecting pads 172 each disposed on adjacent island substrates 111. Further, the conductive particles may form a conductive path by electrically connecting a gate pad 171 formed on island substrates 111 disposed on the outermost island substrate 111 to a pad disposed in the non-active area NA.

Referring to FIG. 2, the base polymer of the first connecting line 181 and the conductive particles distributed in the base polymer may connect in a straight shape the pads disposed on adjacent island substrates 111. To this end, the base polymers may be formed in a straight shape connecting the pads disposed on each of the plurality of island substrates 111 in the manufacturing process. Accordingly, the conductive paths formed by the conductive particles distributed in the base polymers also may be a straight shape. However, the shape and the process of forming the base polymer and the conductive particles of the first connecting line 181 may not be limited thereto.

Referring to FIG. 2, the second connecting line 182 may be formed by extending to the top surface of the lower substrate 110 in contact with the top surface and a side surface of the bank 116, and side surfaces of the planarization layer 115, the inter-layer insulating layer 114, and the buffer layer 112, which are formed on the island substrate 111, and sides of the plurality of island substrates 111. Accordingly, the second connecting line 182 may be in contact with the top surface of the lower substrate 110, a side surface of an adjacent island substrate 111, and side surfaces of the buffer layer 112, the gate insulating layer 113, the inter-layer insulating layer 114, the planarization layer 115, and the bank 116 disposed on the adjacent island substrate 111. The second connecting line 182 may be in contact with the data pads 173 disposed on adjacent island substrates 111, but is not limited thereto.

The base polymer of the second connecting line 182 may be made of a bendable or stretchable insulating material similar to the lower substrate 110, and may be made of the same material as the base polymer of the first connecting line 181. The base polymer, for example, may include silicon rubber such as polydimethylsiloxane (PDMS), an elastomer such as polyurethane (PU) and polytetrafluoroethylene (PTFE), styrene butadiene styrene (SBS), etc., but is not limited thereto.

Further, the conductive particles of the second connecting line 182 may be distributed in the base polymer. In detail, the second connecting line 182 may include conductive particles distributed with predetermined density in the base polymer. At this time, the conductive particles distributed at the upper portion and the lower portion in the base polymer of the second connecting line 182 may be substantially the same in density. The manufacturing process of the second connecting line 182 may be the same as that of the first connecting line 181 or may be simultaneously performed.

The conductive particles disposed and distributed in the base polymer of the second connecting line 182 may form a conductive path electrically connecting the data pads 173 respectively disposed on adjacent island substrates 111. Further, the conductive particles may form a conductive path by electrically connecting a data pad 173 formed on the outermost island substrate 111 of a plurality of island substrates 111 to a pad disposed in the non-active area NA.

Referring to FIG. 2, the base polymer of the second connecting line 182 and the conductive particles distributed in the base polymer may connect in a straight shape the pads disposed on adjacent island substrates 111. To this end, the base polymers may be formed in a straight shape connecting between the pads disposed on each of the plurality of island substrates 111 in the manufacturing process. Accordingly, the conductive paths formed by the conductive particles distributed in the base polymers also may be a straight shape. However, the shape and the process of forming the base polymer and the conductive particles of the second connecting line 182 may not be limited thereto.

Referring to FIG. 3 again, the upper substrate 120 and the polarizing layer 190 are disposed on the encapsulation layer 117 and the lower substrate 110.

The upper substrate 120 is a substrate supporting various components disposed under the upper substrate 120. In detail, the upper substrate 120 may be formed by coating a material constituting the upper substrate 120 onto the lower substrate 110, the island substrate 111, and the connecting line 180 and then hardening the substrate. Accordingly, the upper substrate 120 may be disposed in contact with the lower substrate 110, the island substrate 111, and the connecting line 180.

However, the present disclosure is not limited thereto, and the upper substrate 120 may be formed in a film type. Accordingly, the upper substrate 120 may be bonded by disposing a separate adhesive layer to the bottom surface of the upper substrate 120 and then laminating the upper substrate 120 and the adhesive layer to the lower substrate 110, the island substrate 111, and the connecting line 180.

The upper substrate 120, which is a flexible substrate, may be made of a bendable or stretchable insulating material. The upper substrate 120, which is a flexible substrate, may reversibly expand and contract. Further, an elastic modulus may be several to hundreds of MPa and a tensile fracture rate may be 100% or more. The thickness of the upper substrate 120 may be 10 μm to 1 mm, but is not limited thereto.

The upper substrate 120 may be made of the same material as the lower substrate 110. For example, the upper substrate 120 may be made of silicon rubber such as polydimethylsiloxane (PDMS) or an elastomer such as polyurethane (PU) and polytetrafluoroethylene (PTFE), so it may have flexibility. The material of the upper substrate 120, however, is not limited thereto.

The polarizing layer 190 is disposed on the upper substrate 120. The polarizing layer 190 can polarize light incident into the stretchable display device 100 from the outside. The polarized light incident into the stretchable display device 100 through the polarizing layer 190 may be reflected in the stretchable display device 100, so the phase of the light may be changed. The light with the changed phase may not pass through the polarizing layer 190. Accordingly, the light incident into the stretchable display device 100 from the outside of the stretchable display device 100 is not discharged back to the outside of the stretchable display device 100, so the external light reflection of the stretchable display device 100 may be reduced.

A stretchable display device needs an easily bending or stretching characteristic, so there have been attempts to use substrates that have a flexible property due to a small modulus. However, when a flexible material such as polydimethylsiloxane (PDMS) having a small modulus is used as a lower substrate that is disposed in the process of manufacturing display elements, there is a problem that the substrate is damaged by high temperature, for example, temperature over 100° C. that is generated in the process of forming transistors and the display elements due to the characteristic that a material having a small modulus is weak to heat.

Accordingly, the display elements should be formed on a substrate made of a material that can withstand high temperature, so damage to the substrate can be suppressed in the process of manufacturing the display elements. Accordingly, there have been attempts to manufacture a substrate using materials that can withstand high temperature, which is generated in the manufacturing process, such as polyimide (PI). However, the materials that can withstand high temperature do not have flexible properties due to large moduli, so the substrates are not easily bent or stretched when the stretchable display devices are stretched.

Therefore, since the plurality of island substrates 111 that is rigid substrates is disposed only in the areas where transistors 150 or organic light emitting elements 160 are disposed in the stretchable display device 100 according to an aspect of the present disclosure, damage to the plurality of island substrates 111 due to high temperature in the process of manufacturing the transistors 150 or the organic light emitting elements 160 may be suppressed.

Further, the lower substrate 110 and the upper substrate 120 that are flexible substrates may be disposed under and over the plurality of island substrates 111 in the stretchable display device 100 according to an aspect of the present disclosure. Accordingly, the other areas of the lower substrate 110 and the upper substrate 120 excepting the areas overlapping the plurality of island substrates 111 can be easily stretched or bent, so the stretchable display device 100 can be achieved. Further, it is possible to suppress the damage of the stretchable display device 100 by the transistors 150, the organic light emitting elements 160, etc. disposed on the plurality of island substrates 111 that is rigid substrates when the stretchable display device 100 is bent or stretched.

Meanwhile, when a stretchable display device is bent or stretched, a lower substrate that is a flexible substrate is deformed and island substrates that are rigid substrates on which organic light emitting elements are disposed may not be deformed. In this case, if the lines connecting each of the pads disposed on the plurality of island substrates are not made of an easily bendable or stretchable material, the lines may be damaged, such as cracking, due to deformation of the lower substrate.

Unlike this, in the stretchable display device 100 according to an aspect of the present disclosure, it is possible to electrically connect the pads disposed on each of the plurality of island substrates 111, using the connecting lines 180 including a base polymer and conductive particles. The base polymer is soft to be able to be easily deformed. Accordingly, the stretchable display device 100 of an aspect of the present disclosure has an effect that even though the stretchable display device 100 is deformed such as bending or stretching, the areas between the plurality of island substrates 111 can be easily deformed by the connecting lines 180 including the base polymer.

Further, according to the stretchable display device 100 of an aspect of the present disclosure, since the connecting lines 180 include conductive particles, the conductive paths composed of the conductive particles may not be damaged such as cracking even by deformation of the base polymer. For example, when the stretchable display device 100 is deformed such as bending or stretching, the lower substrate 110 that is a flexible substrate may be deformed in the other areas excepting the areas where the plurality of island substrates 111 that is rigid substrates is disposed. At this time, the distance between the conductive particles disposed on the deforming lower substrate 110 may be changed. At this time, the density of the plurality of conductive particles disposed at the upper portion of the base polymers and forming the conductive paths may be maintained at a high level to be able to transmit electrical signals even though the distance between the plurality of conductive particles is increased. Accordingly, even if the base polymers are bent or stretched, the conductive paths formed by the plurality of conductive particles may smoothly transmit electrical signals. Further, even though the stretchable display device 100 is deformed such as bending or stretching, electrical signals may be transmitted each between the pads.

In the stretchable display device 100 according to an aspect of the present disclosure, since the connecting lines 180 include a base polymer and conductive particles, the connecting lines 180 respectively connecting the pads disposed on the plurality of adjacent island substrates 111 may be disposed in a straight shape to make a shortest distance. That is, the stretchable display device 100 may be achieved even if the connecting lines 180 are not formed in a curved shape. The conductive particles of the connecting lines 180 are distributed in the base polymers and form conductive paths. Further, when the stretchable display device 100 is deformed such as bending or stretching, the conductive paths formed by the conductive particles may be bent or stretched. In this case, only the distance between the conductive particles is changed and the conductive paths formed by the conductive particles can still transmit electrical signals. Therefore, in the stretchable display device 100 according to an aspect of the present disclosure, it is possible to minimize the space occupied by the connecting lines 180.

Figure 4:
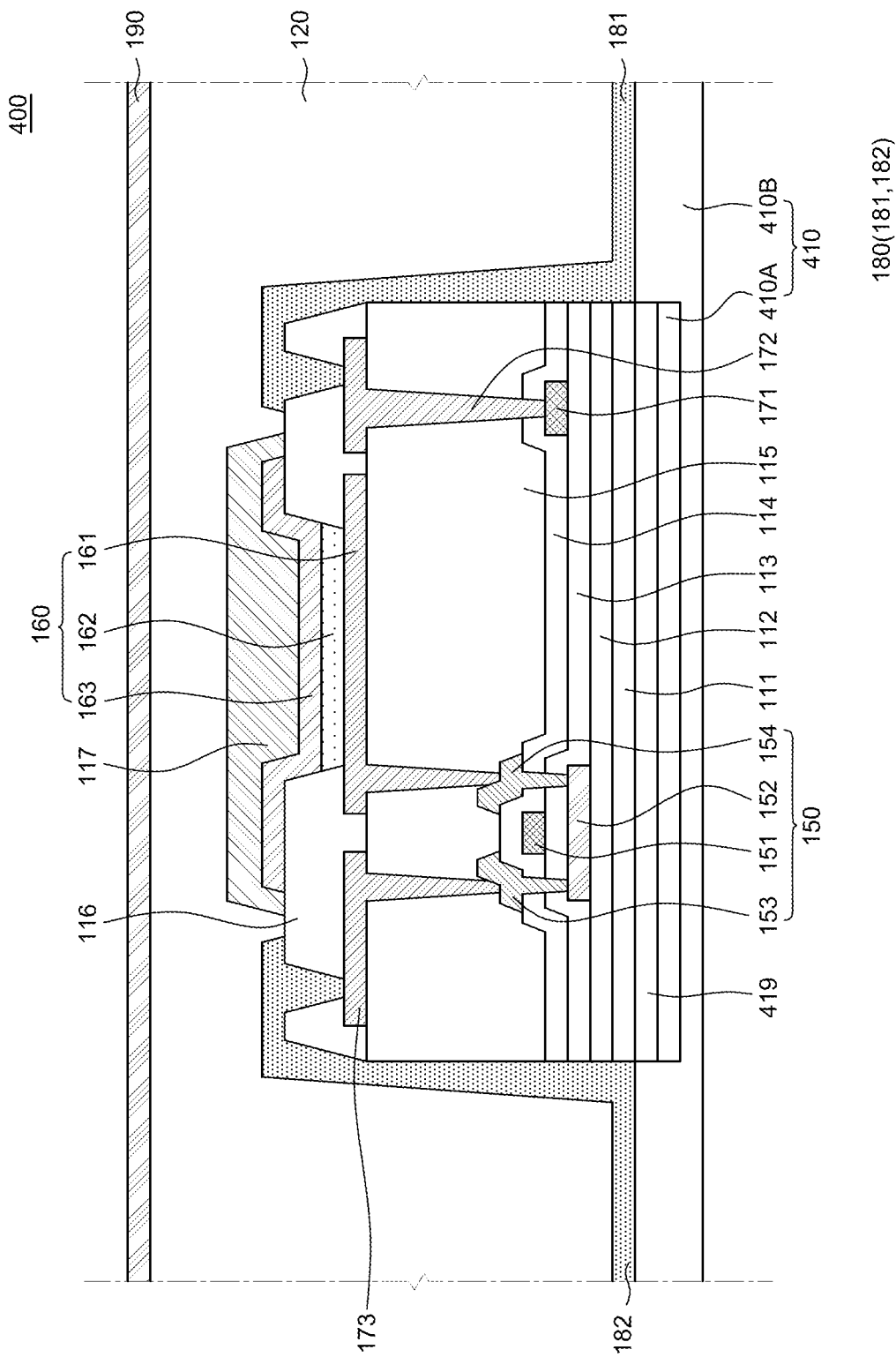
FIG. 4 is a schematic cross-sectional view of one subpixel of a stretchable display device according to another aspect of the present disclosure.

FIG. 4 is a schematic cross-sectional view of one subpixel of a stretchable display device according to another aspect of the present disclosure. A stretchable display device 400 shown in FIG. 4 is substantially the same as the stretchable display device 100 shown in FIGS. 1 to 3 except for having a different lower substrate 410 and lower adhesive layer 419, so repeated description is not provided.

Referring to FIG. 4, the lower substrate 410 supporting components of the stretchable display device 400 is disposed. In more detail, referring to FIG. 4, the lower substrate 410 includes a plurality of first lower patterns 410A and second lower patterns 410B.

A plurality of first lower patterns 410A is disposed in the areas overlapping a plurality of island substrates 111 on the lower substrate 410. The plurality of first lower patterns 410A may be disposed under the plurality of island substrates 111 with the top surfaces bonded to the bottom surfaces of the plurality of island substrates 111 by a lower adhesive layer 419.

Further, the second lower pattern 410B includes a plurality of grooves. In detail, the first lower pattern 410A and the lower adhesive layer 419 are disposed in the plurality of grooves of the second lower pattern 410B. That is, the second lower patterns 410B may be disposed to surround the side surfaces and the bottom surfaces of the plurality of first lower patterns 410A and the lower adhesive layer 419. However, the second lower patterns 410B are not limited thereto and may be disposed in the same plane as the first lower patterns 410A. Further, the second lower substrate 410B may be in contact with the bottom surface of the connecting line 180.

The plurality of first lower patterns 410A may be larger in modulus than the second lower patterns 410B. Accordingly, the plurality of first lower patterns 410A may be a plurality of lower rigid patterns that is more rigid than the second lower patterns 410B, and the second lower patterns 410B may be flexible lower patterns that are more flexible than the plurality of first lower patterns 410A. The modulus of the plurality of first lower patterns 410A may be a thousand times or more larger than that of the second lower patterns 410B, but is not limited thereto.

The plurality of first lower patterns 410A may be made of the same material as the plurality of island substrates 111, may be made of a plastic material having flexibility, and for example, may be made of polyimide (PI), polyacrylate, polyacetate, or the like. However, the plurality of first lower patterns 410A is not limited thereto and may be made of a material having a modulus that is the same as or smaller than that of the island substrates 111.

The second lower patterns 410B, which are flexible lower substrates, may reversibly expand and contract and may have an elastic modulus of several to hundreds of MPa and a tensile fracture rate of 100% or more. Accordingly, the second lower patterns 410B may be made of a bendable or stretchable insulating material and may be made of silicon rubber such as polydimethylsiloxane (PDMS) or an elastomer such as polyurethane (PU) and polytetrafluoroethylene (PTFE), but are not limited thereto.

Referring to FIG. 4, the plurality of island substrates 111 is disposed on the lower substrate 410. The plurality of island substrates 111 is disposed in areas overlapping the first lower patterns 410A of the lower substrate 410. The plurality of island substrates 111 is spaced apart from each other and disposed on the lower substrate 410. The separation distance between the plurality of island substrates 111 and the separation distance between the plurality of first lower patterns 410A of the lower substrate 410 may be the same. For example, the plurality of island substrates 111 is spaced a predetermined distance apart from each other, so they may be disposed in a matrix shape on the lower substrate 410, as shown in FIGS. 1 and 2, but are not limited thereto. Further, although the size of the island substrate 111 is shown as the same as the size of the first lower pattern 410A, the present disclosure is not limited thereto and the size of the first lower pattern 410A may be larger than the size of the island substrate 111.

In the stretchable display device 400 according to another aspect of the present disclosure, the lower substrate 410 includes the plurality of first lower patterns 410A overlapping the plurality of island substrates 111 and the second lower patterns 410B excepting the plurality of first lower patterns 410A. Further, the plurality of first lower patterns 410A is larger in modulus than the second lower patterns 410B. When the stretchable display device 400 is deformed such as bending or stretching, the plurality of first lower patterns 410A disposed under the plurality of island substrates 111 may support the plurality of island substrates 111 as rigid lower patterns. Accordingly, various elements disposed on the plurality of island substrates 111 may be supported together with the plurality of island substrates 111 by the plurality of first lower patterns 410A and damage to the elements due to deformation of the stretchable display device 400 may be reduced.

Further, as described above, the plurality of first lower patterns 410A is made of the same material as the plurality of island substrates 111 and has a modulus higher than the second lower patterns 410B. Accordingly, when the stretchable display device 400 is deformed such as bending or stretching, the plurality of first lower patterns 410A is stretched more than the plurality of island substrates 111 without deformation, and the plurality of first lower patterns 410A and the plurality of island substrates 111 may keep firmly bonded to each other. Therefore, since the plurality of first lower patterns 410A and the plurality of island substrates 111 may keep firmly bonded to each other in the stretchable display device 400 according to another aspect of the present disclosure, defect of the stretchable display device 400 can be reduced even if the stretchable display device 400 is continuously deformed such as bending or stretching.

Since the second lower patterns 410B not overlapping the plurality of island substrates 111 have a flexible property in comparison with the plurality of first lower patterns 410A, the areas where the second lower patterns 410B are disposed between the plurality of island substrates 111 may be freely bent or stretched. Accordingly, the connecting lines 180 disposed by overlapping the second lower patterns 410B also may be freely bent or stretched. Therefore, the stretchable display device 400 according to another aspect of the present disclosure may be more easily deformed such as bending or stretching.

Figure 5:
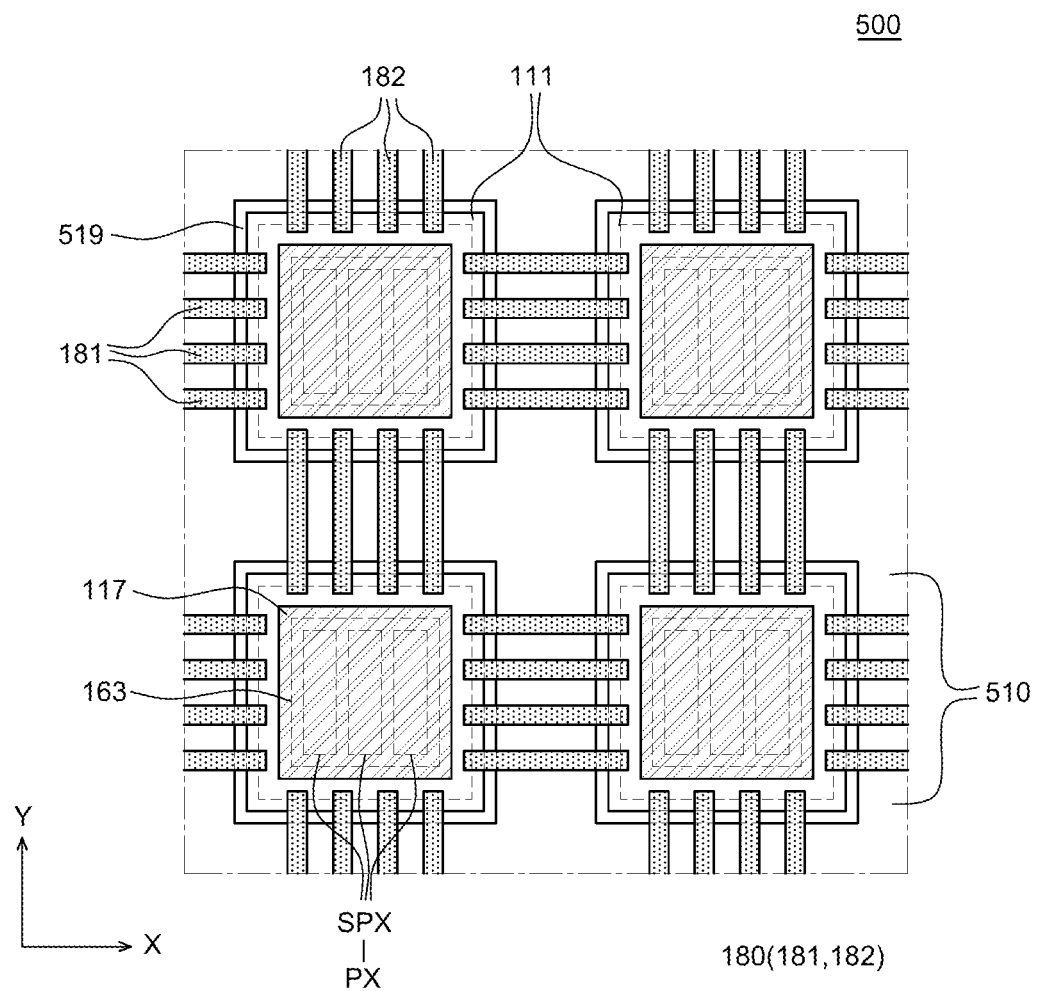
FIG. 5 is an enlarged plan view of a stretchable display device according to another aspect of the present disclosure.
Figure 6:
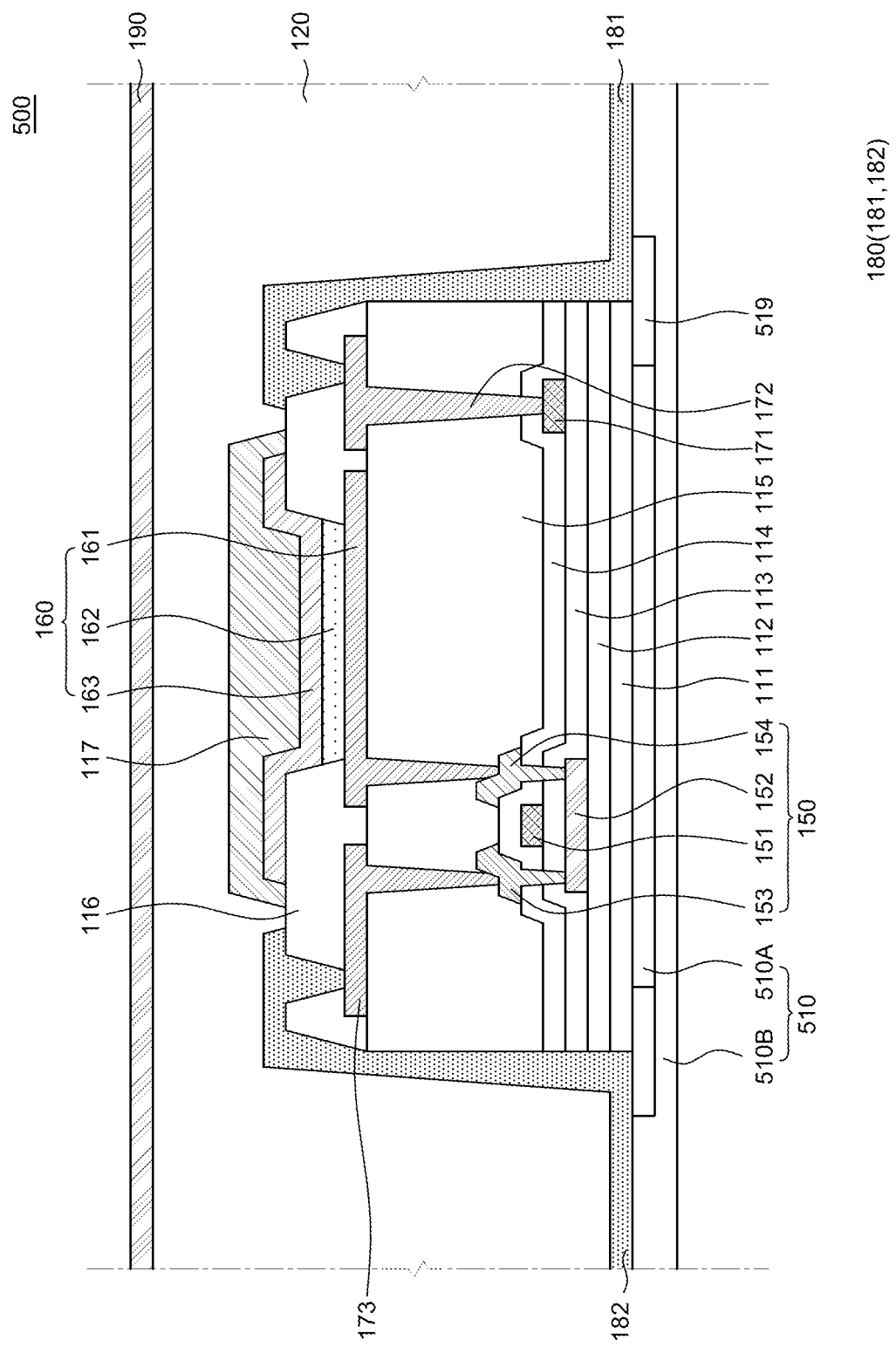
FIG. 6 is a schematic cross-sectional view of one subpixel of a stretchable display device according to another aspect of the present disclosure.

FIG. 5 is an enlarged plan view of a stretchable display device according to another aspect of the present disclosure. FIG. 6 is a schematic cross-sectional view of one subpixel of a stretchable display device according to another aspect of the present disclosure. The stretchable display device 500 of FIGS. 5 and 6 is substantially the same as the stretchable display device 400 shown in FIG. 4 except for having a different lower substrate 510 and lower adhesive layer 519, so repeated description is not provided.

First, referring to FIG. 6, the lower substrate 510 is disposed under a plurality of island substrates 111 and connecting lines 180 and includes a plurality of first lower patterns 510A and a second lower pattern 510B. In this case, the plurality of first lower patterns 510A may be respectively disposed in a plurality of grooves of a second lower pattern 510B, the bottom surfaces of the plurality of first lower patterns 510A may be disposed so as to be in contact with the top surface of the second lower pattern 510B, and sides of the plurality of first lower patterns 510A may be disposed to be spaced apart from the second lower pattern 510B. Further, the top surfaces of the plurality of first lower patterns 510A may be disposed so as to be in contact with the bottom surfaces of the plurality of island substrates 111.

Referring to FIGS. 5 and 6, the lower adhesive layer 519 may be disposed to overlap the boundary of a plurality of island substrate 111. In detail, a portion of the lower adhesive layer 519 is disposed to overlap the plurality of island substrates 111 and the other portion is disposed to overlap a connecting line 180, thereby being able to bond the plurality of island substrates 111 and the connecting line 180. In detail, the top surface of the lower adhesive layer 519 may overlap the boundary of an island substrate 111, and the top surface of the lower adhesive layer 519 disposed inside with respect to the boundary of the island substrate 111 may be in contact with the bottom surface of the island substrate 111, and the top surface of the lower adhesive layer 519 disposed outside with respect to the boundary of the island substrate 111 may be in contact with the bottom surface of a connecting line 180.

Referring to FIG. 6, the lower adhesive layer 519 may be disposed between a plurality of first lower patterns 510A and second lower patterns 510B of the lower substrate 510. In detail, the lower adhesive layer 519 may be disposed to overlap the boundaries of the plurality of island substrates 111 in the plurality of grooves of the second lower pattern 510B and to surround sides of the plurality of first lower patterns 510A. Accordingly, the lower adhesive layer 519 may bond the plurality of first lower patterns 510A and second lower patterns 510B and may bond the plurality of island substrates 111 and the connecting lines 180.

In this case, the lower adhesive layer 519 may be made of a material having a relatively low modulus. For example, the lower adhesive layer 519 has a lower modulus than a plurality of first lower patterns 510A and second lower patterns 510B of the lower substrate 510. Accordingly, the lower adhesive layer 519 is able to more easily attenuate stress that is generated when the stretchable display device 500 is stretched than the lower substrate 510.

In general, when a stretchable display device is stretched, stress concentrates on the boundaries of a plurality of island substrates. Accordingly, when a stretchable display device is stretched, a plurality of island substrates and a lower substrate are separated from each other or the island substrates may be damaged due to the stress concentrating on the boundaries of the plurality of island substrates.

Accordingly, in the stretchable display device 500 according to another aspect of the present disclosure, the lower adhesive layer 519 is disposed to overlap the boundaries of a plurality of island substrates 111, thereby being able to minimize stress that concentrates on the plurality of island substrates 111 when the stretchable display device 500 is stretched. In detail, referring to FIGS. 5 and 6, the top surface of the lower adhesive layer 519 may overlap the boundary of an island substrate 111, and the top surface of the lower adhesive layer 519 disposed inside with respect to the boundary of the island substrate 111 may be in contact with the bottom surface of the island substrate 111, and the top surface of the lower adhesive layer 519 disposed outside with respect to the boundary of the island substrate 111 may be in contact with the bottom surface of a connecting line 180. Further, since the lower adhesive layer 519 has a smaller modulus than the plurality of island substrates 111 and the lower substrate 510, it may perform functions that reduce stress that concentrates on the island substrates 111 when the stretchable display device 500 is stretched and bonds the island substrates 111 and the lower substrate 510. Accordingly, in the stretchable display device 500 according to another aspect of the present disclosure, the lower adhesive layer 519 is disposed at the boundaries of the plurality of island substrates 111, whereby it is possible to reduce stress that concentrates on the plurality of island substrates 111 when the stretchable display device 500 is stretched. Therefore, even though the stretchable display device 500 is repeatedly stretched, the phenomenon of separation of the island substrates 111 and the lower substrate 510 can be minimized.

Figure 7:
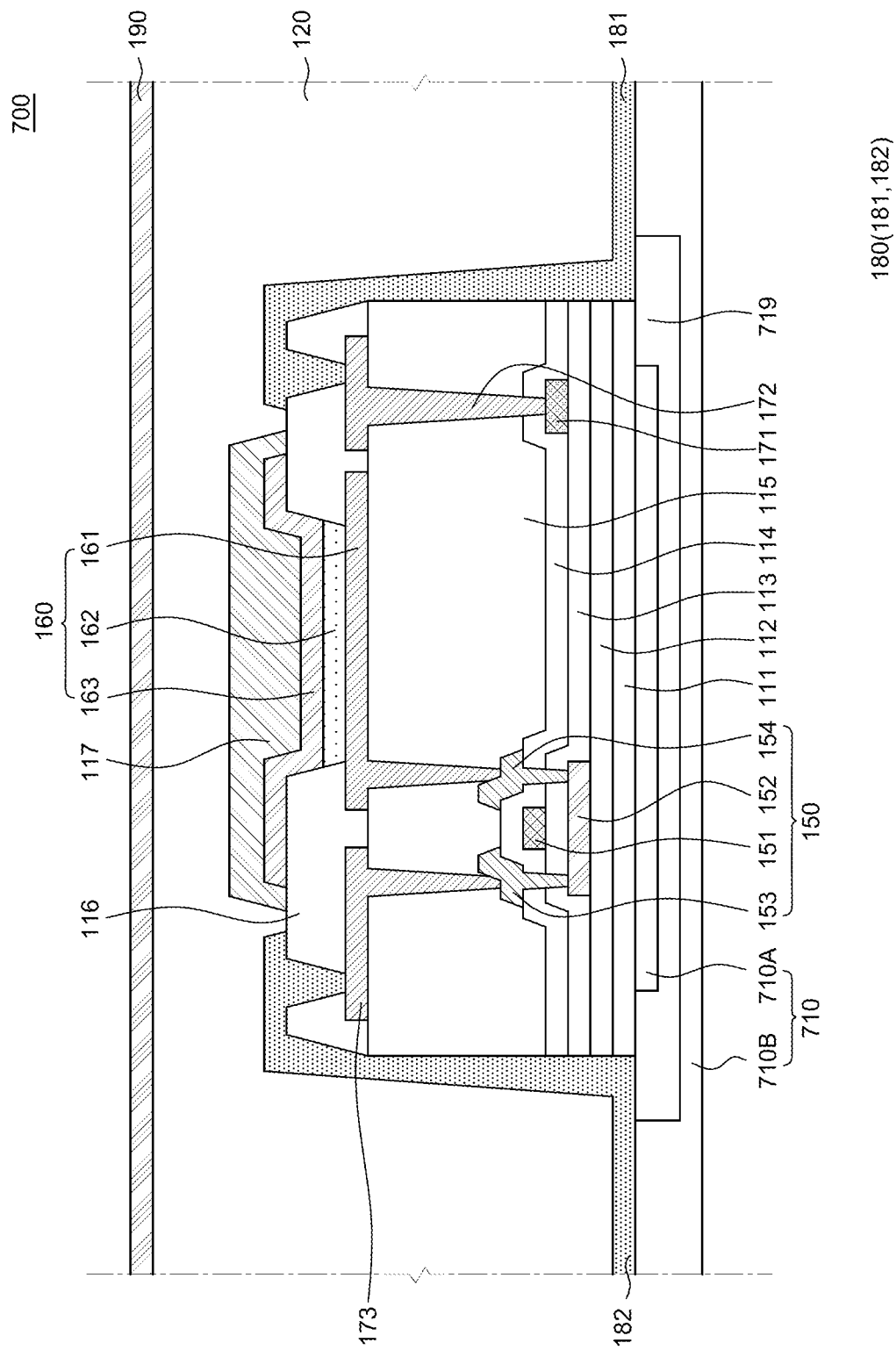
FIG. 7 is a schematic cross-sectional view of one subpixel of a stretchable display device according to another aspect of the present disclosure.

FIG. 7 is a schematic cross-sectional view of one subpixel of a stretchable display device according to another aspect of the present disclosure. A stretchable display device 700 of FIG. 7 is substantially the same as the stretchable display device 500 shown in FIGS. 5 and 6 except for having a different lower substrate 710 and lower adhesive layer 719, so repeated description is not provided.

Referring to FIG. 7, a plurality of first lower patterns 710A and second lower patterns 710B are spaced apart from each other by lower adhesive layers 719 on a lower substrate 710. That is, the plurality of first lower patterns 710A and the second lower patterns 710B can be spaced apart from each other by disposing the lower adhesive layers 710 in a plurality of grooves of the second lower patterns 710B and disposing the plurality of first lower patterns 710A on the lower adhesive layer 719.

Referring to FIG. 7, the lower adhesive layers 719 may be disposed between the plurality of first lower patterns 710A and the second lower patterns 710B of the lower substrates 710. In detail, the lower adhesive layers 719 are disposed to surround the side surfaces and the bottom surfaces of the plurality of first lower patterns 710A and the second lower patterns 710B are disposed to surround the side surfaces and the bottom surfaces of the lower adhesive layers 719, whereby the plurality of first lower patterns 710A and the second lower patterns 710B can be bonded by the adhesive layers 719.

In the stretchable display device 700 according to another aspect of the present disclosure, the lower adhesive layers 710 may be disposed to surround the plurality of first lower patterns 710A and the second lower patterns 710B may be disposed to surround the lower adhesive layers 719. Accordingly, the lower adhesive layers 719 are disposed so as to be in contact with all surfaces except for the surfaces where the plurality of first lower patterns 710A is in contact with the island substrates 111 and in contact with all inner surfaces of the grooves of the second lower patterns 710B. Accordingly, in the stretchable display device 700 according to another aspect of the present disclosure, it is possible to effectively attenuate stress that concentrates on the boundaries of the plurality of island substrates 111 when the stretchable display device 700 is stretched, and it is possible to increase the adhesive strength of the plurality of first lower patterns 710A and the second lower patterns 710B. Accordingly, even though the stretchable display device 700 is repeatedly stretched, the phenomenon of separation of the island substrates 111 and the lower substrate 710 from each other and the phenomenon of separation of the plurality of first lower patterns 710A and the second lower patterns 710B of the lower substrate 710 from each other can be minimized.

Figure 8:
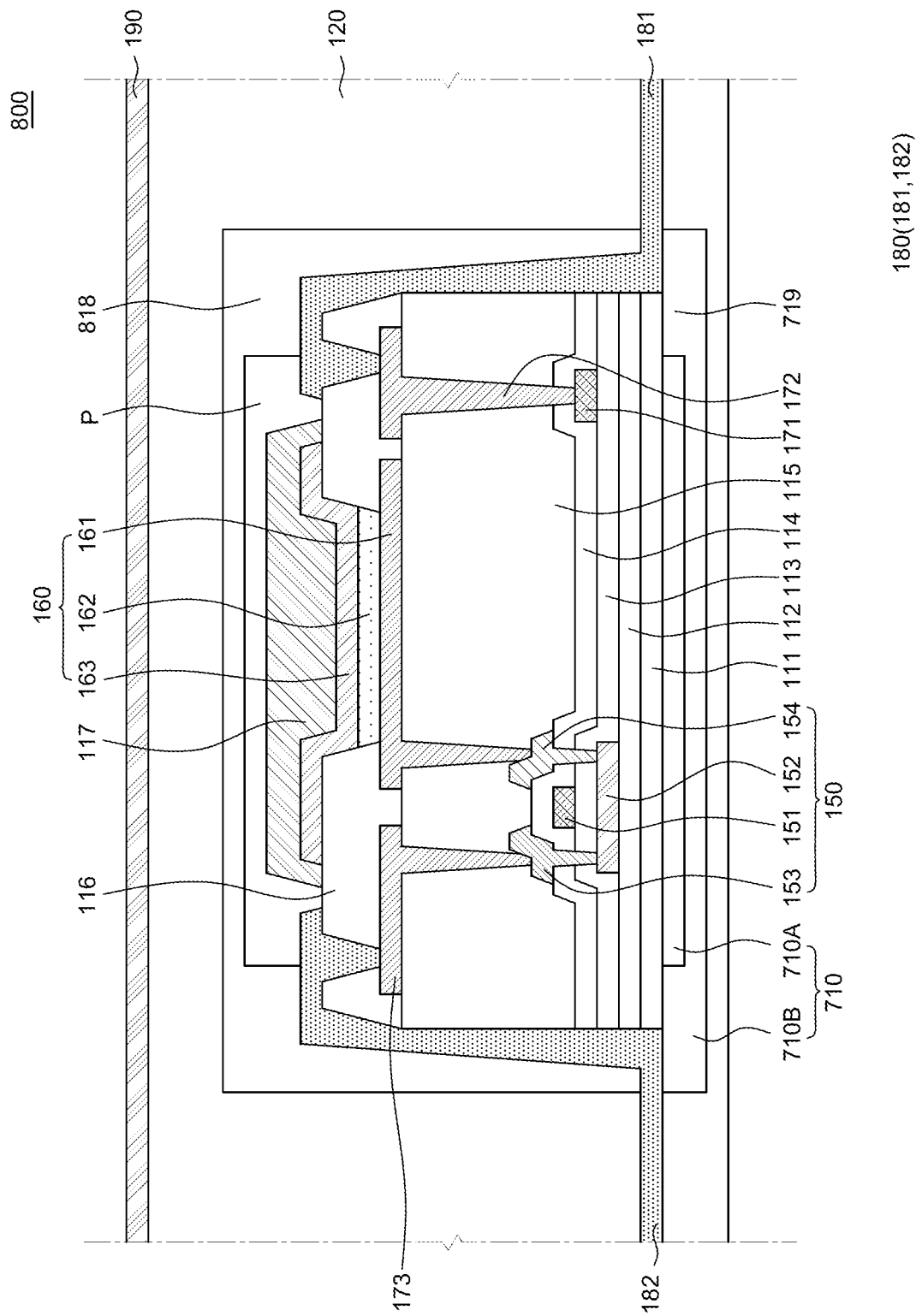
FIG. 8 is a schematic cross-sectional view of one subpixel of a stretchable display device according to yet another aspect of the present disclosure.

FIG. 8 is a schematic cross-sectional view of one subpixel of a stretchable display device according to another aspect of the present disclosure. The stretchable display device 800 of FIG. 8 is substantially the same as the stretchable display device 700 of FIG. 7 except that a protective member P and an upper adhesive layer 818 are further formed, so repeated description is not provided.

Referring to FIG. 8, the stretchable display device 800 may further include an upper adhesive layer 818 and a protective member P.

First, the protective member P may be disposed to cover a display element such as the organic light emitting element 160. In detail, the protective member P may be disposed to cover the organic light emitting element 160 and to be surrounded by the upper adhesive layer 818. In this case, the protective member P is made of a material having the same modulus as the modulus of a plurality of island substrates 111, so that it is possible to fix the organic light emitting element 160 that is moved in accordance with stretch of the stretchable display device 800. However, the present disclosure is not limited thereto, and the protective member P may be omitted, depending on design of the stretchable display device 800.

Referring to FIG. 8, the upper adhesive layer 818 is disposed to cover the plurality of island substrates 111, the organic light emitting element 160, and portions of a plurality of connecting lines 180 disposed on the plurality of island substrates 111. The upper adhesive layer 818 may be disposed to overlap the boundaries of the plurality of island substrates 111. For example, in a plane surface, the upper adhesive layer 818 may be disposed to overlap a lower adhesive layer 719 and the upper adhesive layer 818 may have the same area as the lower adhesive layer 719. The upper adhesive layer 818 may be made of the same modulus as a modulus of the lower adhesive layer 719, but is not limited thereto.

Referring to FIG. 8, an upper substrate 120 may be disposed to surround the upper adhesive layer 818. In detail, the upper substrate 120 may be formed by coating on the upper adhesive layer 818, the plurality of connecting lines 180, and the lower substrate 710.

In the stretchable display device 800 according to another aspect of the present disclosure, the upper adhesive layer 818 may be disposed to cover a display element such as the organic light emitting element 160 and portions of the connecting lines 180. In this case, the upper adhesive layer 818 may be disposed to overlap a lower adhesive layer 719 and the upper adhesive layer 818 may be made of a material having the same modulus as the modulus of the lower adhesive layer 719. Accordingly, the stretchable display device 800 according to another aspect of the present disclosure further includes the upper adhesive layer 818 and the upper adhesive layer 818 is disposed to cover the boundaries of the plurality of island substrates 111. Therefore, it is possible to more effectively reduce the stress that concentrates on the boundaries of the plurality of island substrates 111 and the connecting lines 180 when the stretchable display device 800 is stretched. Accordingly, damage to the plurality of island substrates 111 and the connecting lines 180 can be minimized.

Further, in the stretchable display device 800 according to another aspect of the present disclosure, the protective member P may be disposed between a display element such as the organic light emitting element 160 and the upper adhesive layer 818. In this case, the protective member P may be made of a material having the same modulus as the modulus of the island substrates 111. That is, the protective member P may be made of a material having a higher modulus than the upper adhesive layer 818. Accordingly, the stretchable display device 800 according to another aspect of the present disclosure, since the protective member P is disposed between a display element such as the organic light emitting element 160 and the upper adhesive layer 818, it is possible to reduce movement of the organic light emitting element 160 when the stretchable display device 800 is stretched.

Figure 9:
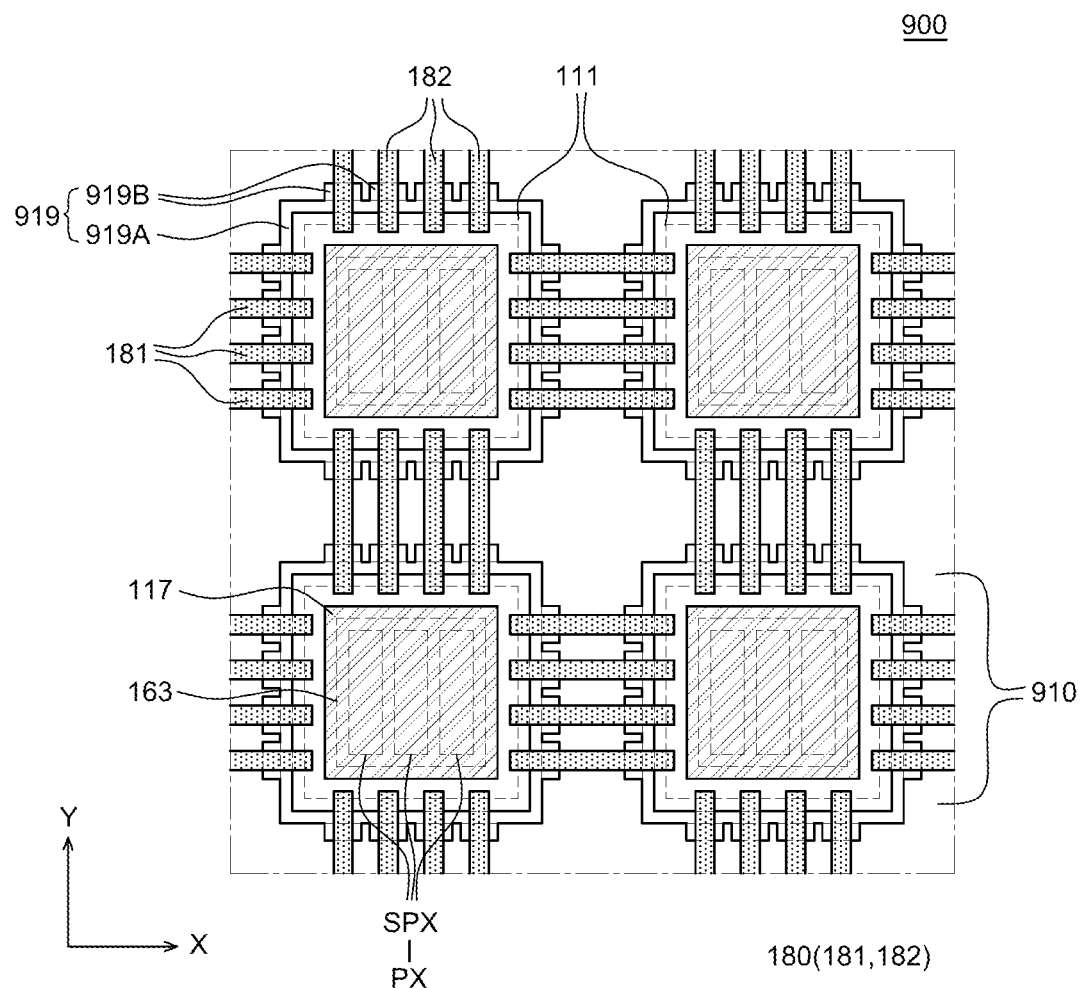
FIG. 9 is an enlarged plan view of a stretchable display device according to another aspect of the present disclosure.

FIG. 9 is an enlarged plan view of a stretchable display device according to another aspect of the present disclosure. The stretchable display device 900 of FIG. 9 is substantially the same as the stretchable display device 700 of FIG. 7 except for having a different lower adhesive layer 919, so repeated description is not provided.

Referring to FIG. 9, the lower adhesive layer 919 includes a first adhesive layer 919A and a plurality of second adhesive layers 919B protruding from the first adhesive layer 919A.

The first adhesive layer 919A is disposed between a plurality of first lower patterns 710A and second lower patterns 710B. In detail, the first adhesive layer 919A is disposed at the boundaries of a plurality of island substrates 111, that is, a portion of the first adhesive layer 919A is disposed to overlap the plurality of island substrates 111 and the other portion is disposed to overlap connecting lines 180, thereby being able to bond the plurality of island substrates 111 and the connecting lines 180. The first adhesive layer 910A is substantially the same as the lower adhesive layer 719 described with reference to FIG. 7, repeated description is not provided.

The second adhesive layers 919B may be defined as portions protruding from the first adhesive layer 919A in accordance with the shape of the plurality of connecting lines 180. In detail, the second adhesive layer 919B may be disposed under the connecting lines 180 in accordance with the shapes in which the connecting lines 180 extend from each side of the first adhesive layer 919A.

In the stretchable display device 900 according to another aspect of the present disclosure, the lower adhesive layer 919 is configured to include the first adhesive layer 919A and the second adhesive layer 919B, so it is possible to effectively reduce damage to the connecting lines 180 when the stretchable display device 900 is stretched. In detail, when the stretchable display device 900 is stretched, stress may concentrate not only at the boundaries of the plurality of island substrates 111, but on the plurality of connecting lines 180. Accordingly, in the stretchable display device 900 according to another aspect of the present disclosure, the lower adhesive layer 919 is configured to include not only the first adhesive layer 919A disposed at the boundaries of the plurality of island substrates 111, but the second adhesive layer 919B disposed on the bottom surface adjacent to the plurality of island substrates 111, so it is also possible to effectively reduce damage to the connecting lines 180 when the stretchable display device 900 is stretched.

Figure 10:
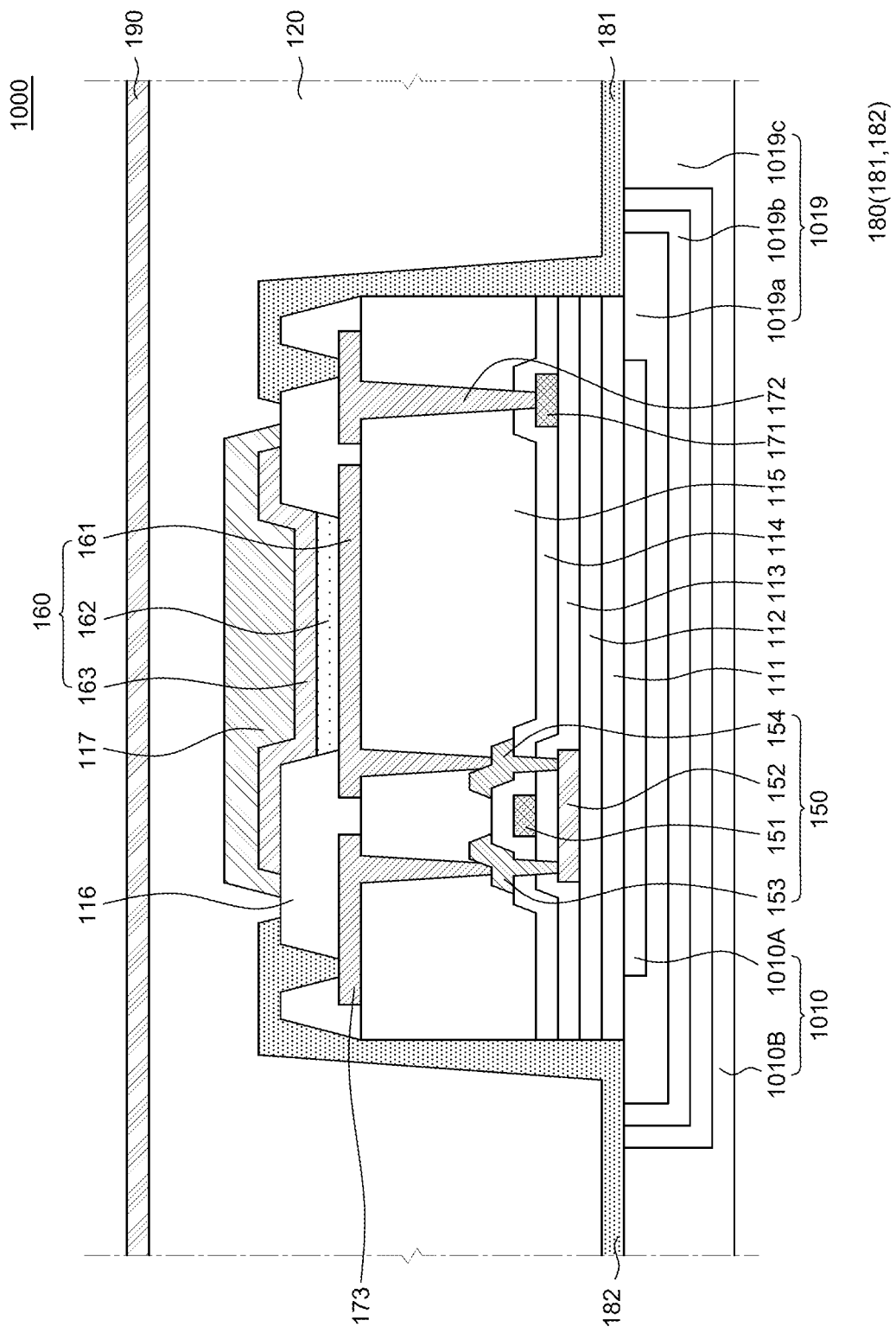
FIG. 10 is a schematic cross-sectional view of one sub-pixel of a stretchable display device according to another aspect of the present disclosure.

FIG. 10 is a schematic cross-sectional view of one sub-pixel of a stretchable display device according to another aspect of the present disclosure. The stretchable display device 1000 of FIG. 10 is substantially the same as the stretchable display device 700 of FIG. 7 except for having a different lower substrate 1010 and lower adhesive layer 1019, so repeated description is not provided.

Referring to FIG. 10, the lower adhesive layer 1019 may include a plurality of sub-lower adhesive layers 1019a, 1019b, and 1019c. In detail, the plurality of sub-lower adhesive layers 1019a, 1019b, and 1019c of the lower adhesive layer 1019 may be sequentially disposed between a plurality of first lower patterns 1010A and second lower patterns 1010B.

Referring to FIG. 10, the lower adhesive layer 1019 may be composed of a first sub-lower adhesive layer 1019a, a second sub-lower adhesive layer 1019b, and a third sub-lower adhesive layer 1019c. In this case, the sub-lower adhesive layers 1019a, 1019b, and 1019c may be disposed to surround sub-lower adhesive layers 1019a, 1019b, and 1019c disposed at an upper side, respectively. In detail, the first sub-lower adhesive layer 1019a may be disposed to surround the plurality of first lower patterns 1010A of the lower substrate 1010, the second sub-lower adhesive layer 1019b may be disposed to surround the first sub-lower adhesive layer 1019a, and the third sub-lower adhesive layer 1019c may be disposed to surround the second sub-lower adhesive layer 1019b. In this case, the second lower pattern 1010B of the lower substrate 1010 may be disposed to surround the third sub-lower adhesive layer 1019c. However, the number of the plurality of sub-lower adhesive layers 1019a, 1019b, and 1019c shown in FIG. 10 is an example, and the plurality of sub-lower adhesive layers 1019a, 1019b, and 1019c may be changed in various ways in accordance with design and is not limited thereto.

The modulus of each of the plurality of sub-lower adhesive layers 1019a, 1019b, and 1019c may decrease as it goes away from the plurality of island substrates 111. In detail, the modulus of the second sub-lower adhesive layer 1019b may be smaller than the modulus of the first sub-lower adhesive layer 1019a and the modulus of the third sub-lower adhesive layer 1019c may be smaller than the modulus of the second sub-lower adhesive layer 1019b. Further, the modulus of the first sub-lower adhesive layer 1019a may be smaller than the modulus of the plurality of first lower patterns 1010A and the modulus of the second lower pattern 1010B may be smaller than the modulus of the third sub-lower adhesive layer 1019c. That is, the plurality of first lower patterns 1010A, the first sub-lower adhesive layer 1019a, the second sub-lower adhesive layer 1019b, the third sub-lower adhesive layer 1019c, and the second lower pattern 1010B may sequentially decrease in modulus.

In the stretchable display device 1000 according to another aspect of the present disclosure, the lower adhesive layer 1019 is configured to include the plurality of sub-lower adhesive layers 1019a, 1019b, and 1019c, so it is possible to more effectively reduce stress that concentrates on the plurality of island substrates 111 when the stretchable display device 1000 is stretched. In detail, the modulus of the plurality of sub-lower adhesive layers 1019a, 1019b, and 1019c may decrease as they go away from the plurality of island substrates 111. That is, the modulus may decrease as it goes from the plurality of first lower patterns 1010A to the plurality of sub-lower adhesive layers 1019a, 1019b, and 1019c and the second lower pattern 1010B. Accordingly, when the lower adhesive layer 1019 is composed of the plurality of sub-lower adhesive layers 1019a, 1019b, and 1019c, it is possible to effectively reduce stress that concentrates on the plurality of island substrates 111 when the stretchable display device 1000 is stretched.

Figure 11:
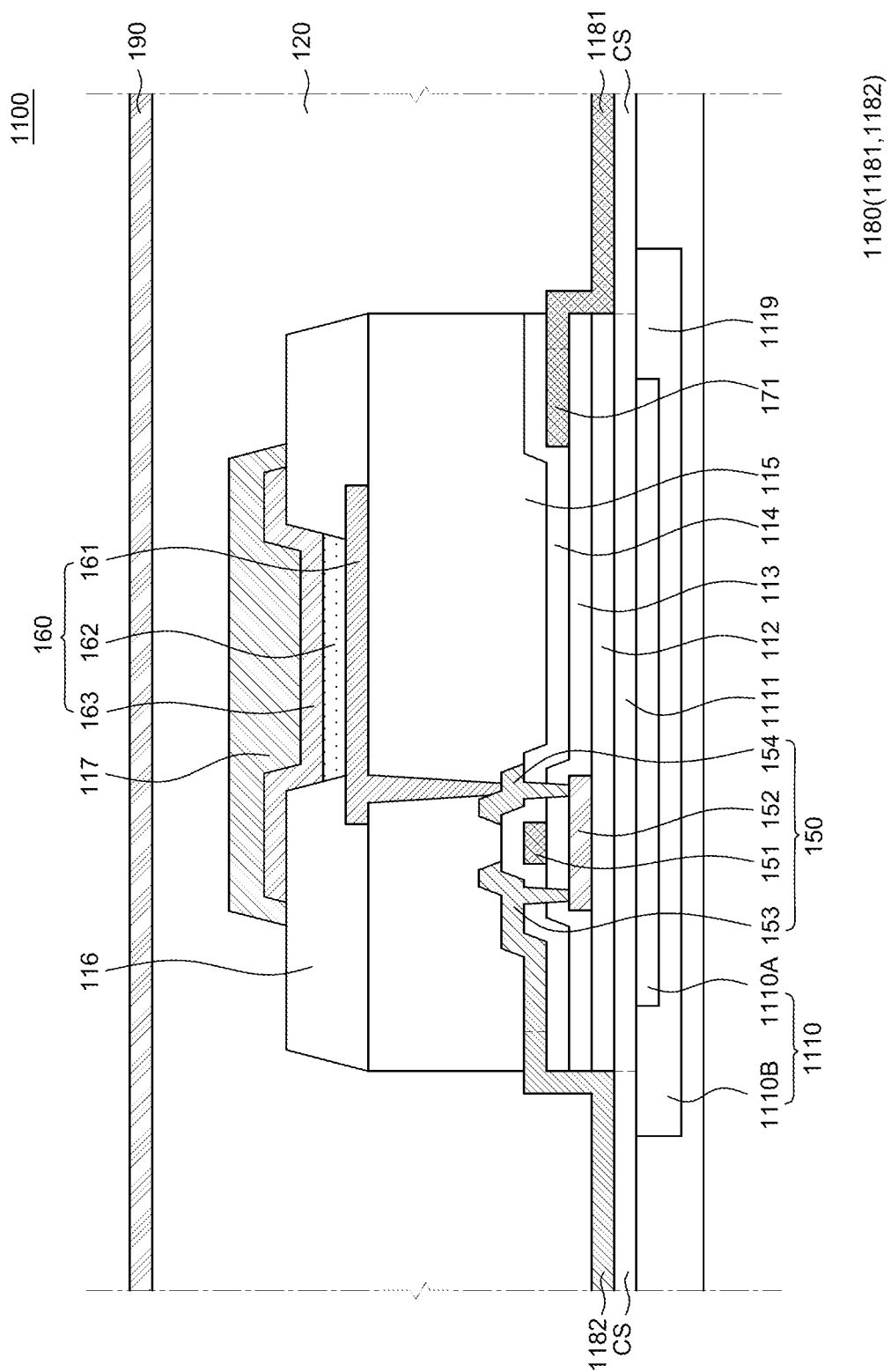
FIG. 11 is a schematic cross-sectional view of one sub-pixel of a stretchable display device according to another aspect of the present disclosure.

FIG. 11 is a schematic cross-sectional view of one sub-pixel of a stretchable display device according to another aspect of the present disclosure. The stretchable display device 1100 of FIG. 11 is substantially the same as the stretchable display device 700 of FIG. 7 except for having different island substrates 1111, connecting substrates CS, and connecting lines 1180, so repeated description is not provided.

Referring to FIG. 11, the stretchable display device 1100 further includes a plurality of connecting substrates CS. In detail, the plurality of connecting substrates CS is substrates that are disposed between a plurality of island substrates 1111 and connects adjacent island substrates 1111. The plurality of connecting substrates CS may be simultaneously made of the same material as the island substrates 1111, but is not limited thereto.

Referring to FIG. 11, each of the plurality of connecting lines 1180 is disposed on each of the plurality of connecting substrates CS. The plurality of connecting substrates CS and the plurality of connecting lines 1180 may have shapes corresponding to each other. For example, when the plurality of connecting substrates CS has the shape of a sine wave, the plurality of connecting lines 1180 disposed on the plurality of connecting substrates CS may also have the shape of a sine wave. However, the plurality of connecting substrates CS may have a width larger than that of the plurality of connecting lines 1180 to stably support the plurality of connecting lines 1180.

Referring to FIG. 11, a lower adhesive layer 1119 may be disposed at the boundaries of the plurality of connecting substrates CS. In detail, the lower adhesive layer 1119 is disposed to overlap the boundaries where the plurality of island substrates 1111 is in contact with the plurality of connecting substrates CS, thereby being able to bond the plurality of island substrates 1111, the plurality of connecting substrates CS, and the lower substrate 1110.

Referring to FIG. 11, a gate pad 171 is formed on a gate insulating layer 113 and a first connecting line 1181 is formed on the gate insulating layer 113 and a plurality of connecting substrates CS.

Referring to FIG. 11, the first connecting line 1181 that can function as a gate line is connected with the gate pad 171 and extends from the gate insulating layer 113 to the connecting substrates CS. Accordingly, the first connecting lines 1181 may electrically connect the gate pads 171 respectively formed on adjacent island substrates 1111. The first connecting lines 1181 are in contact with the plurality of connecting substrates CS between the plurality of island substrates 1111.

The first connecting line 1181 and the gate pad 171 may be made of the same material as a gate electrode 151. Accordingly, the first connecting line 1181 and the gate pad 171 may be simultaneously formed in the same process as the gate electrode 151. Accordingly, the first connecting line 1181 may be integrally formed by extending from the gate pad 171. However, the present disclosure is not limited thereto, and the gate pad 171 and the first connecting line 1181 may be made of different materials, and may be disposed on different layers and electrically connected.

Referring to FIG. 11, a second connecting line 1182 that can function as a data line is formed on an inter-layer insulating layer 114. At this time, the source electrode 153 may extend outside an island substrate 1111, may function as a data pad, and may be electrically connected with the second connecting line 1182. However, the present disclosure is not limited thereto, and a separate data pad may be defined as extending from the source electrode 153 or being electrically connected with the source electrode 153.

The second connecting line 1182 is connected with the source electrode 153 and extends from an adjacent island substrate 1111 to the plurality of connecting substrates CS. Accordingly, the second connecting line 1182 can electrically connect the data pad formed on each of adjacent island substrates 1111. The second connecting lines 1182 are in contact with the plurality of connecting substrates CS between the plurality of island substrates 1111.

The second connecting line 1182 may be made of the same material as a data pad, that is, the source electrode 153. Accordingly, the second connecting line 1182, the source electrode 153, and the drain electrode 154 may be simultaneously formed in the same process. Accordingly, the second connecting line 1182 may be integrally formed by extending from the source electrode 153 However, the present disclosure is not limited thereto, and the second connecting line 1182 and the source electrode 153 may be made of different materials and may be disposed on different layers and electrically connected.

In the stretchable display device 1100 according to another aspect of the present disclosure, connecting lines 1180 electrically connecting pads formed on the plurality of island substrates 1111, such as the first connecting line 1181 and the second connecting line 1182, may be made of the same material as at least one of a plurality of conductive components disposed on the plurality of island substrates 1111. For example, the first connecting line 1181 may be made of the same material as the gate electrode 151 and the second connecting line 1182 may be made of the same material as the source electrode 153. However, the present disclosure is not limited thereto and the connecting lines 1180 may be made of the same materials as, other than the gate electrode 151 and the source electrode 153, a drain electrode 154, the electrodes of an organic light emitting element 160 such as an anode 161 and a cathode 163 of the organic light emitting element 160, and various lines included in the stretchable display device 1100. Accordingly, the connecting lines 1180 may be simultaneously formed in the manufacturing process of conductive components disposed on the plurality of island substrates 1111 and made of the same material as the connecting lines 1180 in the stretchable display device 1100 according to another aspect of the present disclosure. Therefore, there may not be a need for a separate manufacturing process for forming the connecting lines 1180.

Figure 12:
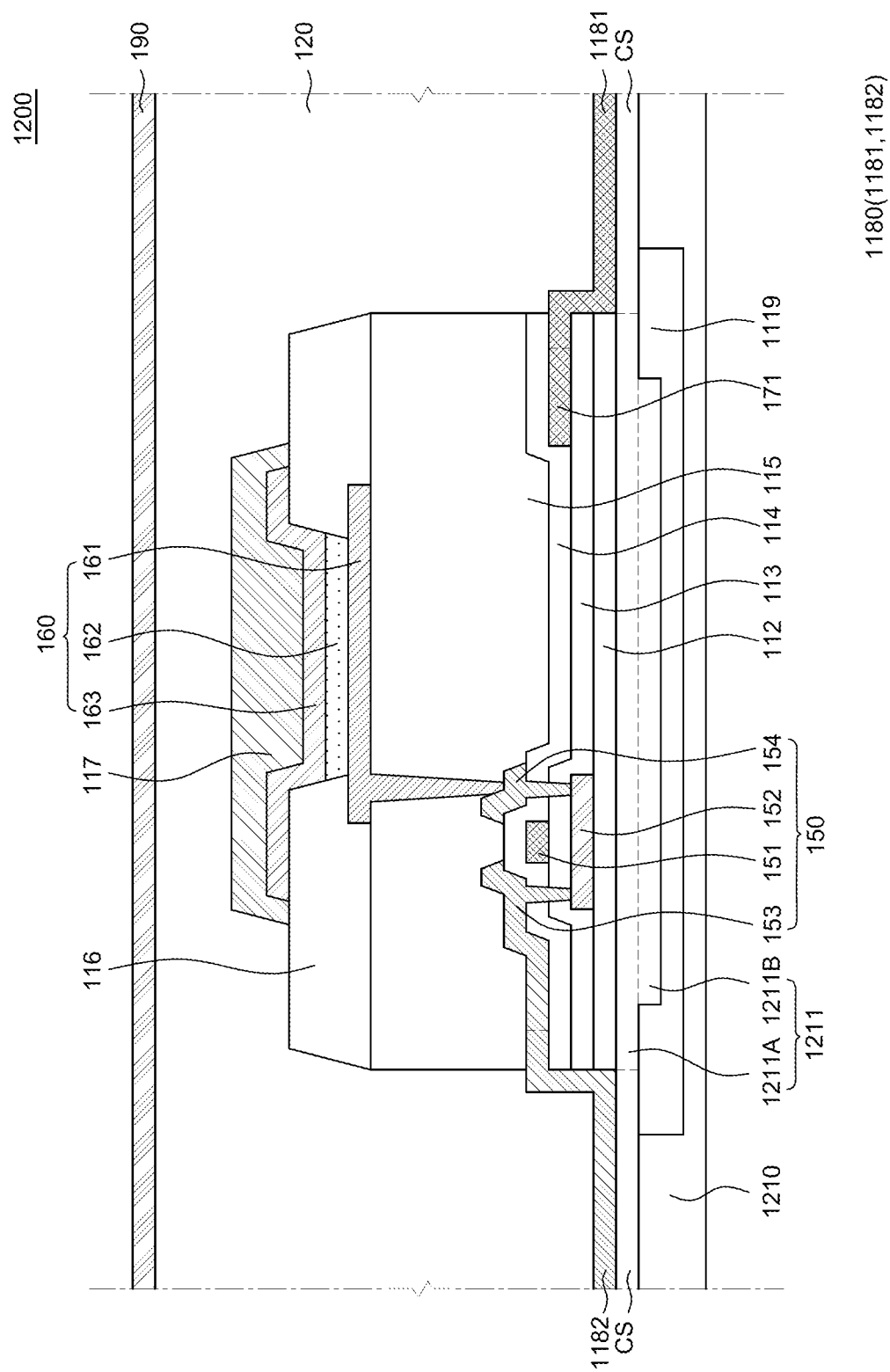
FIG. 12 is a schematic cross-sectional view of one sub-pixel of a stretchable display device according to another aspect of the present disclosure.

FIG. 12 is a schematic cross-sectional view of one sub-pixel of a stretchable display device according to another aspect of the present disclosure. The stretchable display device 1200 of FIG. 12 is substantially the same as the stretchable display device 1100 of FIG. 11 except for having a different plurality of island substrates 1211 and a different lower substrate 1210, so repeated description is not provided.

Referring to FIG. 12, the plurality of island substrates 1211 may further include a protrusion 1211B. In detail, the protrusion 1211B may protrude from bases 1211A of the plurality of island substrates 1211 toward the lower portions of the plurality of island substrates 1211 to have a step.

Referring to FIG. 12, the protrusion 1211B may be disposed in a plurality of grooves of the lower substrate 1210. In detail, the protrusion 1211B may be disposed on lower adhesive layers 1119 disposed in the plurality of grooves of the lower substrate 1210. That is, the lower adhesive layers 1119 may be disposed to surround the protrusions 1211B of the plurality of island substrates 1211 and the lower substrate 1210 may be disposed to surround the lower adhesive layers 1119.

In the stretchable display device 1200 according to another aspect of the present disclosure, the plurality of island substrates 1211 includes the protrusions 1211B, so the process may be simple and the process cost may be low when the plurality of island substrates 1211 is manufactured. That is, since the plurality of island substrates 1211 themselves includes the protrusions 1211B without using a separate lower pattern, a simpler process may be achieved.

The exemplary aspects of the present disclosure can also be described as follows:

According to an aspect of the present disclosure, a stretchable display device comprises a plurality of island substrates in which a plurality of pixels is defined and that is spaced apart from each other; a lower substrate disposed under the plurality of island substrates and including a plurality of grooves; a plurality of connecting lines electrically connecting pads disposed on adjacent island substrates of the plurality of island substrates; and a lower adhesive layer disposed under the plurality of island substrates and the plurality of connecting lines, wherein the lower adhesive layer is disposed to overlap the plurality of island substrates.

The lower substrate may include a second lower pattern including the plurality of grooves; and a plurality of first lower patterns disposed in the plurality of grooves, and wherein a modulus of the plurality of first lower patterns may be larger than a modulus of the second lower pattern.

The lower adhesive layer may be disposed between the plurality of first lower patterns and the second lower pattern.

Bottom surfaces of the plurality of first lower patterns and top surface of the second lower pattern may be in contact with each other, and the lower adhesive layer may be disposed to surround side surfaces of the plurality of first lower patterns, thereby bonding the plurality of first lower patterns and the second lower pattern.

The plurality of first lower patterns and the second lower pattern may be spaced apart from each other, and the lower adhesive layer may be disposed to surround the side surfaces and the bottom surfaces of the plurality of first lower patterns, thereby bonding the plurality of first lower patterns and the second lower pattern.

The stretchable display device may further comprise a display element disposed on the plurality of island substrates; an upper adhesive layer covering the plurality of island substrates and portions of the plurality of connecting lines; and an upper substrate disposed on the upper adhesive layer, the plurality of connecting lines, and the lower substrate, wherein the upper adhesive layer may be disposed to overlap boundaries of the plurality of island substrates.

The stretchable display device may further comprise a protective member disposed to cover the display element and surrounded by the upper adhesive layer, wherein a modulus of the protective member may be the same as a modulus of the plurality of island substrates.

A modulus of the upper adhesive layer may be the same as a modulus of the lower adhesive layer.

The lower adhesive layer may include a plurality of sub-lower adhesive layers, and a modulus of each of the plurality of sub-lower adhesive layers may decrease as it goes away from the plurality of island substrates.

The lower adhesive layer may include a first adhesive layer disposed between the plurality of first lower patterns and the second lower pattern; and a plurality of second adhesive layers protruding from the first adhesive layer in accordance with a shape of the plurality of connecting lines.

The plurality of island substrates may further include a protrusion disposed in the plurality of grooves.

The plurality of island substrates may be in contact with the plurality of connecting lines, the plurality of connecting lines may be in contact with the lower substrate, and a portion of a top surface of the lower adhesive layer may be in contact with the plurality of island substrates, and the other portion may be in contact with the plurality of connecting lines.

The stretchable display device may further comprise a plurality of conductive components disposed respectively on the plurality of island substrates; and a plurality of connecting substrates connecting adjacent island substrates of the plurality of island substrates and having the plurality of connecting lines thereon, wherein the plurality of connecting lines may be made of the same material as at least one of the plurality of conductive components, and a portion of a top surface of the lower adhesive layer may be in contact with the plurality of island substrates, and the other portion may be in contact with the plurality of connecting substrates.

A modulus of the lower adhesive layer may be smaller than a modulus of the lower substrate.

According to another aspect of the present disclosure, a stretchable display device comprises a plurality of rigid substrates in which a plurality of pixels is defined and that is spaced apart from each other; a flexible substrate disposed under the plurality of rigid substrates and including a plurality of rigid lower patterns and a flexible lower pattern; and a lower adhesive layer disposed to overlap boundaries of the plurality of rigid substrates, wherein the lower adhesive layer bonds the plurality of rigid lower patterns, the flexible lower pattern, and the plurality of rigid substrates.

The lower adhesive layer may be disposed to cover the plurality of rigid substrates.

The lower adhesive layer may include a plurality of sub-lower adhesive layers, and a modulus of each of the plurality of sub-lower adhesive layers may decrease as it goes away from the plurality of island substrates.

The stretchable display device may further comprise a display element disposed on the plurality of rigid substrates; a plurality of connecting lines electrically connecting pads disposed on adjacent rigid substrates of the plurality of rigid substrates; an upper adhesive layer disposed to overlap boundaries of the plurality of rigid substrates; and an upper substrate disposed on the upper adhesive layer, the plurality of connecting lines, and the flexible substrate.

The stretchable display device may further comprise a plurality of connecting substrates connecting adjacent rigid substrates of the plurality of rigid substrates and each having the plurality of connecting lines thereon, wherein a top surface of the lower adhesive layer may be in contact with all of the plurality of rigid substrates and the plurality of connecting substrates.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A stretchable display device comprising:
  a plurality of island substrates, the plurality of island substrates being spaced apart from each other and defining a plurality of pixels;

a lower substrate disposed under the plurality of island substrates and including:
a plurality of first lower pattern; and
a second lower pattern including a plurality of grooves, wherein the plurality of first lower patterns is disposed in the plurality of grooves;
a plurality of connecting lines electrically connecting pads disposed on adjacent island substrates of the plurality of island substrates; and
a lower adhesive layer disposed to bond the plurality of first lower patterns and the plurality of island substrates, the lower adhesive layer further being disposed under the plurality of connecting lines,
wherein the lower adhesive layer is disposed to overlap the plurality of island substrates.

2. The stretchable display device of claim 1, wherein a rigidity of the plurality of first lower patterns is higher than that of the second lower pattern.

3. The stretchable display device of claim 2, wherein the lower adhesive layer is disposed between the plurality of first lower patterns and the second lower pattern.

4. The stretchable display device of claim 3, wherein bottom surfaces of the plurality of first lower patterns and a top surface of the second lower pattern are in contact with each other, and
wherein the lower adhesive layer disposed to overlap with boundaries of the plurality of the island substrates in the plurality of grooves of the second lower pattern, the lower adhesive layer surrounds side surfaces of the plurality of first lower patterns, and the lower adhesive layer bonds the plurality of first lower patterns and the second lower pattern.

5. The stretchable display device of claim 3, wherein the plurality of first lower patterns and the second lower pattern are spaced apart from each other, and
the lower adhesive layer disposed to overlap with boundaries of the plurality of the island substrates in the plurality of grooves of the second lower pattern, the lower adhesive layer surrounds the side surfaces and the bottom surfaces of the plurality of first lower patterns, and the lower adhesive layer bonds the plurality of first lower patterns and the second lower pattern.

6. The stretchable display device of claim 1, further comprising:
a display element disposed on the plurality of island substrates;
an upper adhesive layer covering the plurality of island substrates and portions of the plurality of connecting lines; and
an upper substrate disposed on the upper adhesive layer, the plurality of connecting lines, and the lower substrate,
wherein the upper adhesive layer overlaps boundaries of the plurality of island substrates.

7. The stretchable display device of claim 6, further comprising a protective member disposed to cover the display element and to surrounded by the upper adhesive layer,
wherein a modulus of the protective member is the same as a modulus of the plurality of island substrates.

8. The stretchable display device of claim 6, wherein the upper adhesive layer has a same modulus as the lower adhesive layer.

9. The stretchable display device of claim 1, wherein the lower adhesive layer includes a plurality of sub-lower adhesive layers, and
wherein a modulus of the plurality of sub-lower adhesive layers decreases as a distance from the plurality of island substrates increases.

10. The stretchable display device of claim 1, wherein the lower adhesive layer includes:
a first adhesive layer disposed between the plurality of first lower patterns and the second lower pattern; and
a plurality of second adhesive layers protruding from the first adhesive layer to match a shape of the plurality of connecting lines.

11. The stretchable display device of claim 1, wherein the plurality of island substrates further includes a protrusion disposed in the plurality of grooves.

12. The stretchable display device of claim 1, wherein the plurality of island substrates is in contact with the plurality of connecting lines,
the plurality of connecting lines is in contact with the lower substrate, and
a first portion of a top surface of the lower adhesive layer is in contact with the plurality of island substrates, and
a second portion of the top surface of the lower adhesive layer different from the first portion is in contact with the plurality of connecting lines.

13. The stretchable display device of claim 1, further comprising:
a plurality of conductive components, each disposed on a respective island substrate of the plurality of island substrates; and
a plurality of connecting substrates connecting adjacent island substrates of the plurality of island substrates and having the plurality of connecting lines formed thereon,
wherein the plurality of connecting lines are made of the same material as at least one of the plurality of conductive components, and
a first portion of a top surface of the lower adhesive layer is in contact with the plurality of island substrates, and
a second portion of the top surface of the lower adhesive layer different from the first portion is in contact with the plurality of connecting substrates.

14. The stretchable display device of claim 1, wherein the lower adhesive layer has a modulus smaller than that of the lower substrate.

* * * * *